US010033201B2

(12) United States Patent
Kaneko et al.

(10) Patent No.: US 10,033,201 B2
(45) Date of Patent: Jul. 24, 2018

(54) BATTERY VOLTAGE MONITORING DEVICE

(75) Inventors: Kazumi Kaneko, Zama (JP); Hirofumi Iguchi, Atsugi (JP); Yuki Takanezawa, Zama (JP)

(73) Assignee: NISSAN MOTOR CO., LTD., Yokohama-shi (JP)

( * ) Notice: Subject to any disclaimer, the term of this patent is extended or adjusted under 35 U.S.C. 154(b) by 491 days.

(21) Appl. No.: 13/265,990

(22) PCT Filed: May 19, 2010

(86) PCT No.: PCT/JP2010/058850
§ 371 (c)(1),
(2), (4) Date: Oct. 24, 2011

(87) PCT Pub. No.: WO2010/134625
PCT Pub. Date: Nov. 25, 2010

(65) Prior Publication Data
US 2012/0046893 A1  Feb. 23, 2012

(30) Foreign Application Priority Data

May 20, 2009  (JP) ................................. 2009-121636
Apr. 14, 2010  (JP) ................................. 2010-093273

(51) Int. Cl.
*H02J 7/00* (2006.01)
*G01R 31/36* (2006.01)
(Continued)

(52) U.S. Cl.
CPC .......... *H02J 7/0021* (2013.01); *B60L 3/0046* (2013.01); *B60L 11/1853* (2013.01);
(Continued)

(58) Field of Classification Search
CPC ............ B60L 11/1864; G01R 31/3658; H01M 10/425; H01M 10/482; H01M 2010/4271;
(Continued)

(56) References Cited

U.S. PATENT DOCUMENTS

2002/0180447 A1  12/2002  Masse et al.
2005/0052810 A1*  3/2005  Suntio et al. ................. 361/115
(Continued)

FOREIGN PATENT DOCUMENTS

CN           1535384 A    10/2004
CN         101133507 A     2/2008
(Continued)

OTHER PUBLICATIONS

Chinese Office Action dated Sep. 30, 2013 (5 pgs.).

*Primary Examiner* — Kyle R Quigley
(74) *Attorney, Agent, or Firm* — Foley & Lardner LLP

(57) ABSTRACT

A battery controller 10 outputs a voltage sampling and holding command signal to an integrated circuit CCn located at an upstream end of cascade connection of integrated circuits CC1-CCn such that integrated circuits CC1-CCn sample and hold output voltages of unit cells 1 grouped into battery modules M1-Mn. The battery controller 10, after transmission of the voltage sampling and holding command signal, outputs a transmission command signal to the integrated circuit CCn at the upstream end of the cascade circuit to transmit output voltages of the unit cells 1 held in the integrated circuits CC1-CCn to the battery controller 10. As a result, a time lag in the detection timings of output voltages of the unit cells 1 of the battery modules M1-Mn can be decreased.

3 Claims, 12 Drawing Sheets

(51) Int. Cl.
   *H01M 10/44*    (2006.01)
   *H01M 10/48*    (2006.01)
   *B60L 3/00*     (2006.01)
   *B60L 11/18*    (2006.01)
   *H04Q 9/00*     (2006.01)

(52) U.S. Cl.
   CPC ...... *G01R 31/3658* (2013.01); *H01M 10/441* (2013.01); *H01M 10/482* (2013.01); *H04Q 9/00* (2013.01); *B60L 2240/545* (2013.01); *B60L 2240/547* (2013.01); *B60L 2250/10* (2013.01); *H04Q 2209/30* (2013.01); *H04Q 2209/823* (2013.01); *Y02T 10/7005* (2013.01); *Y02T 10/705* (2013.01); *Y02T 90/16* (2013.01)

(58) Field of Classification Search
   CPC ....... H01M 2010/4278; H01M 2220/20; H02J 7/0021; H02J 7/0022
   See application file for complete search history.

(56) References Cited

U.S. PATENT DOCUMENTS

2005/0242667  A1*  11/2005  Emori et al. ............... 307/10.1
2006/0238168  A1*  10/2006  Matsuo et al. ............... 320/136
2008/0079395  A1*  4/2008   Miyazaki et al. ........... 320/118
2008/0143543  A1   6/2008   Vandensande et al.
2008/0219337  A1   9/2008   Kawata et al.
2008/0282018  A1*  11/2008  Nakanishi ..................... 710/316
2009/0085516  A1   4/2009   Emori et al.

FOREIGN PATENT DOCUMENTS

| | | |
|---|---|---|
| JP | 2003-070179 A | 3/2003 |
| JP | 2003-134675 A | 5/2003 |
| JP | 2008-211962 A | 9/2008 |
| JP | 2008-220074 A | 9/2008 |
| JP | 2008-281464 A | 11/2008 |
| JP | 2008-281465 A | 11/2008 |
| JP | 2009-89484 A | 4/2009 |
| RU | 2006 103 792 A | 7/2004 |
| RU | 2006 103 792 A | 8/2006 |
| WO | WO 02/27342 A2 | 4/2002 |
| WO | WO 02/097460 A2 | 12/2002 |
| WO | WO 03/083498 A1 | 10/2003 |
| WO | WO 2005/008266 A1 | 1/2005 |
| WO | WO 2006/083080 A1 | 8/2006 |
| WO | WO 2008/108979 A1 | 9/2008 |

* cited by examiner

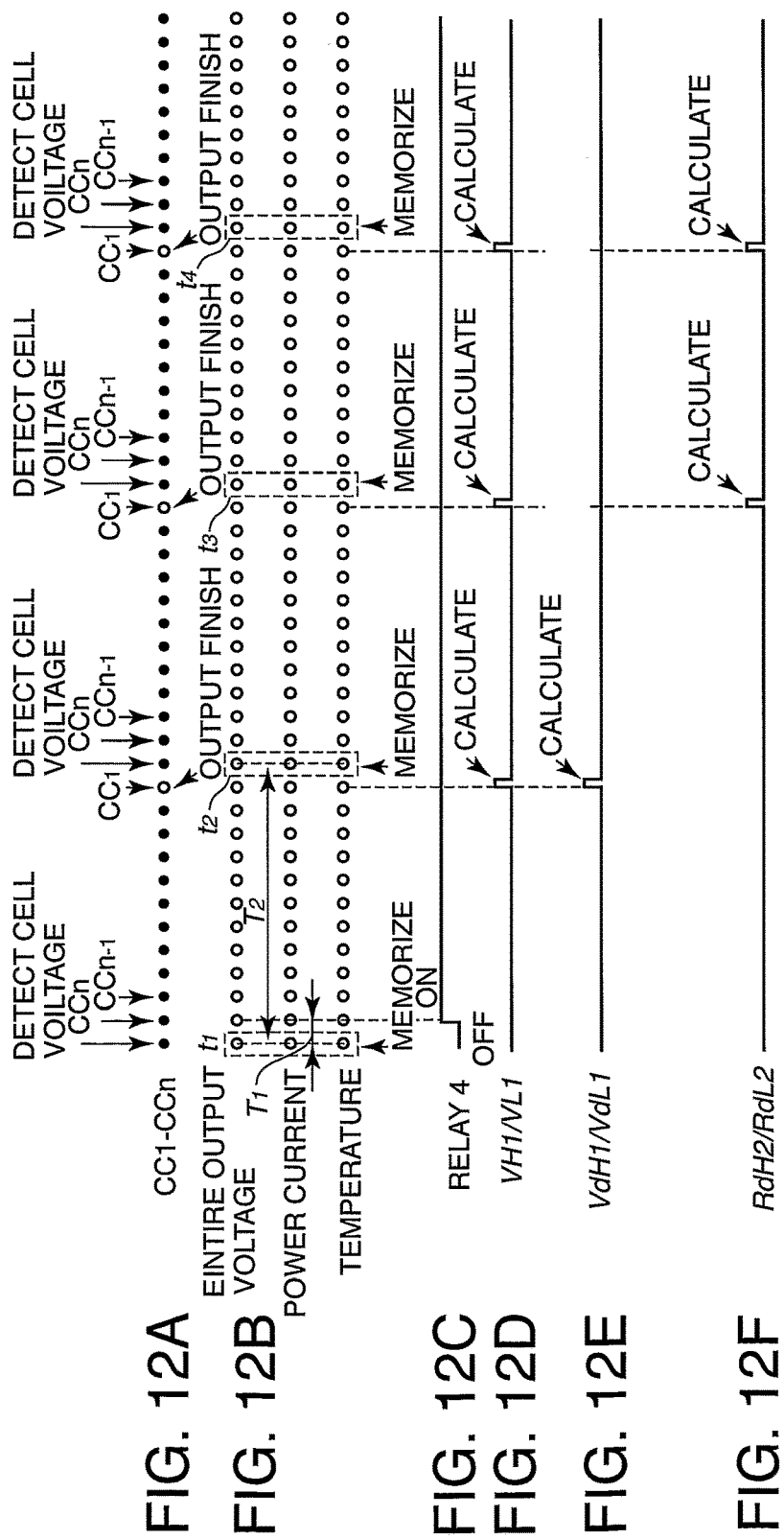

BATTERY VOLTAGE MONITORING DEVICE

FIELD OF THE INVENTION

This invention relates to a monitoring device for a plurality of battery modules, each of which comprises a plurality of unit cells.

BACKGROUND OF THE INVENTION

JP2003-070179A, published by the Japan Patent Office in 2003, proposes a monitoring device that detects a voltage of each unit cell in a plurality of battery modules, each of which comprises a plurality of unit cells.

The monitoring device comprises integrated circuits (IC), each of which detects voltages of the unit cells in each of the battery modules. These integrated circuits are connected to a controller via a so-called cascade connection circuit, and information output from each integrated circuit is processed in the controller. The monitoring device comprises an entire output voltage detection circuit for detecting an entire output voltage of the battery modules and is configured to determine a state of the battery modules through a process of comparing the data obtained from the integrated circuits and the data obtained from the entire output voltage detection circuit.

SUMMARY OF THE INVENTION

Since the monitoring device according to the prior art connects the integrated circuits to the controller via the cascade connection circuit, a voltage detection command signal output from the controller is transmitted to a first integrated circuit that is located furthest upstream in the cascade connection circuit.

When the first integrated circuit receives the voltage detection command signal, it detects voltages of the unit cells connected to the integrated circuit immediately and outputs the detected voltage values together with the voltage detection command signal to a second integrated circuit located next to the first integrated circuit via the cascade connection circuit. The second integrated circuit operates similarly to the first integrated circuit and outputs the detected voltage values together with the voltage detection command signal to a third integrated circuit located next to the second integrated circuit via the cascade connection circuit.

As a result of this communication system, a large amount of time lag appears in the voltage detection timings of the unit cells by the integrated circuits. If the detected voltages are treated as if they were detected at an identical timing, therefore, precision in voltage detection of the unit cells is impaired.

It is therefore an object of this invention to decrease a time lag in the detection timings of output voltages of the unit cells of battery modules, which are connected via a cascade connection circuit.

In order to achieve the above object, this invention provides a battery voltage monitoring device for monitoring an output voltage of a unit cell or unit cells in each of battery modules that are connected in series, comprising integrated circuits, each of which samples and holds the output voltage of the unit cell or unit cells in each of the battery modules, a cascade communication circuit that connects the integrated circuits in series to transmit signals to the integrated circuits according to a connection order of the integrated circuits, and a programmable controller connected to an integrated circuit located at an upstream end of the cascade communication circuit and an integrated circuit located at a downstream end of the cascade communication circuit with respect to signal transmission.

The controller is programmed to output a voltage sampling and holding command signal to the integrated circuit at the upstream end such that the voltage sampling and holding command signal be transmitted to each of the integrated circuits via the cascade communication circuit, the voltage sampling and holding command signal commanding each of the integrated circuits to sample and hold output voltage of the unit cell or unit cells in each of the battery modules, and output a transmission command signal to the integrated circuit at the upstream end such that the transmission command signal be transmitted via the cascade communication circuit to each of the integrated circuits after transmission of the voltage sampling and holding command signal, the transmission command signal commanding each of the integrated circuits to transmit output voltage held by each of the integrated circuits to the controller via the cascade communication circuit.

The details as well as other features and advantages of this invention are set forth in the remainder of the specification and are shown in the accompanying drawings.

BRIEF DESCRIPTION OF THE DRAWINGS

FIGS. 12A-12F are timing charts showing data processing performed by the battery voltage monitoring device according to the fourth embodiment of this invention.

DESCRIPTION OF THE PREFERRED EMBODIMENTS

Figure 1:
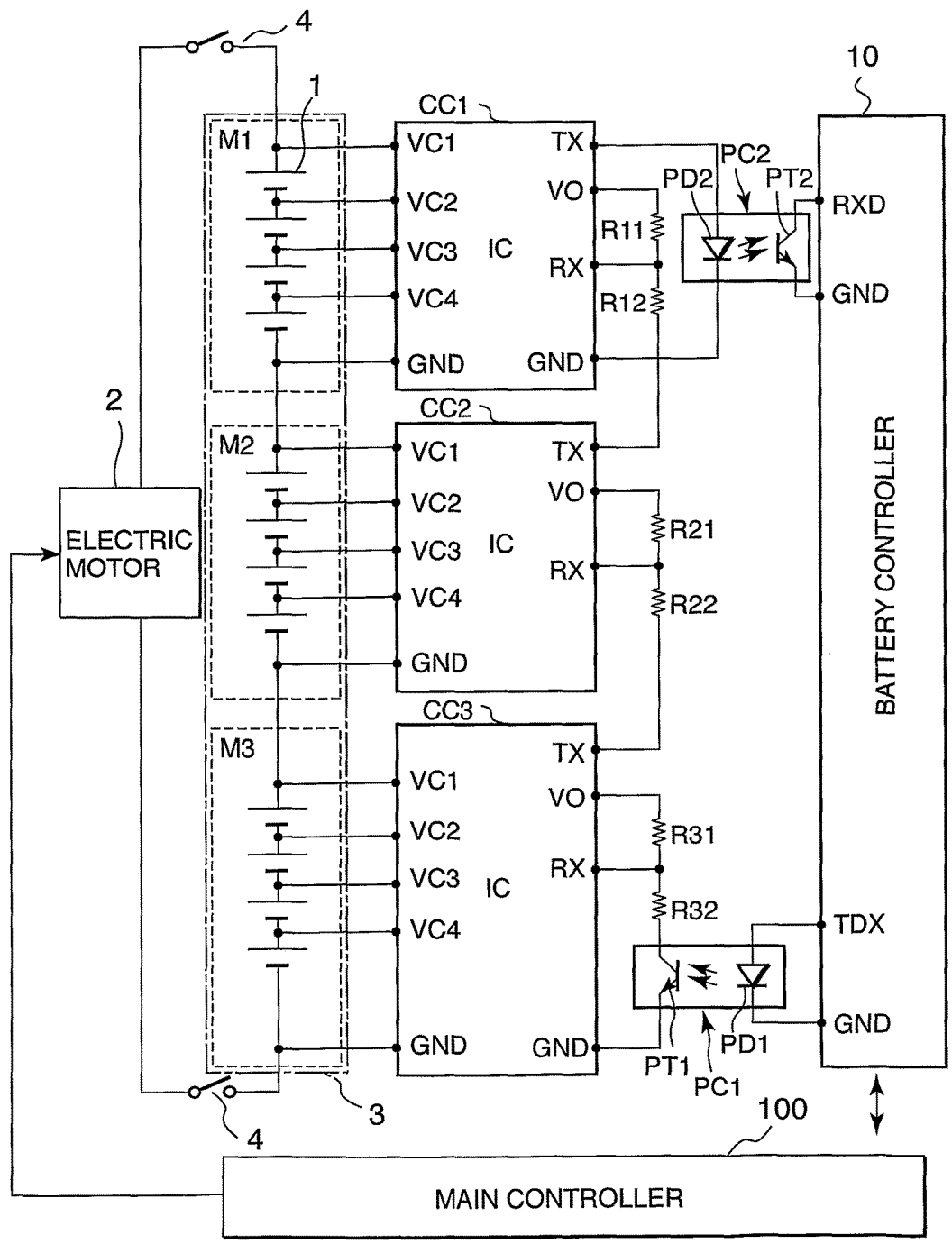
FIG. 1 is an electric circuit diagram of a battery voltage-monitoring device according to this invention.

Referring to FIG. 1 of the drawings, a battery group 3 serving as a motive power source for a hybrid drive electric vehicle or an electric vehicle comprises three battery modules M1, M2, M3 electrically connected in series. Each battery module M1, M2, M3 comprises four unit cells 1.

A battery voltage monitoring device according to this invention detects output voltages of the four unit cells 1 of the respective battery modules M1, M2, M3. The monitoring device comprises three integrated circuits (IC) CC1, CC2, CC3 for this purpose.

An electric motor 2 for driving the vehicle is connected as an electrical load to electrical ends of the battery group 3 via a power-converting device such as an inverter. A relay 4 for switching the main power source of the electric motor 2 ON and OFF is interposed between the battery group 3 and the electric motor 2.

Electrical charging of the battery group 3 is performed using the electric motor 2 as a generator or using an independent generator not shown. When the battery group 3 is charged, charge amounts of the unit cells 1 may show a divergence due to individual differences among the unit cells 1 generated in a manufacturing process.

Figure 2:
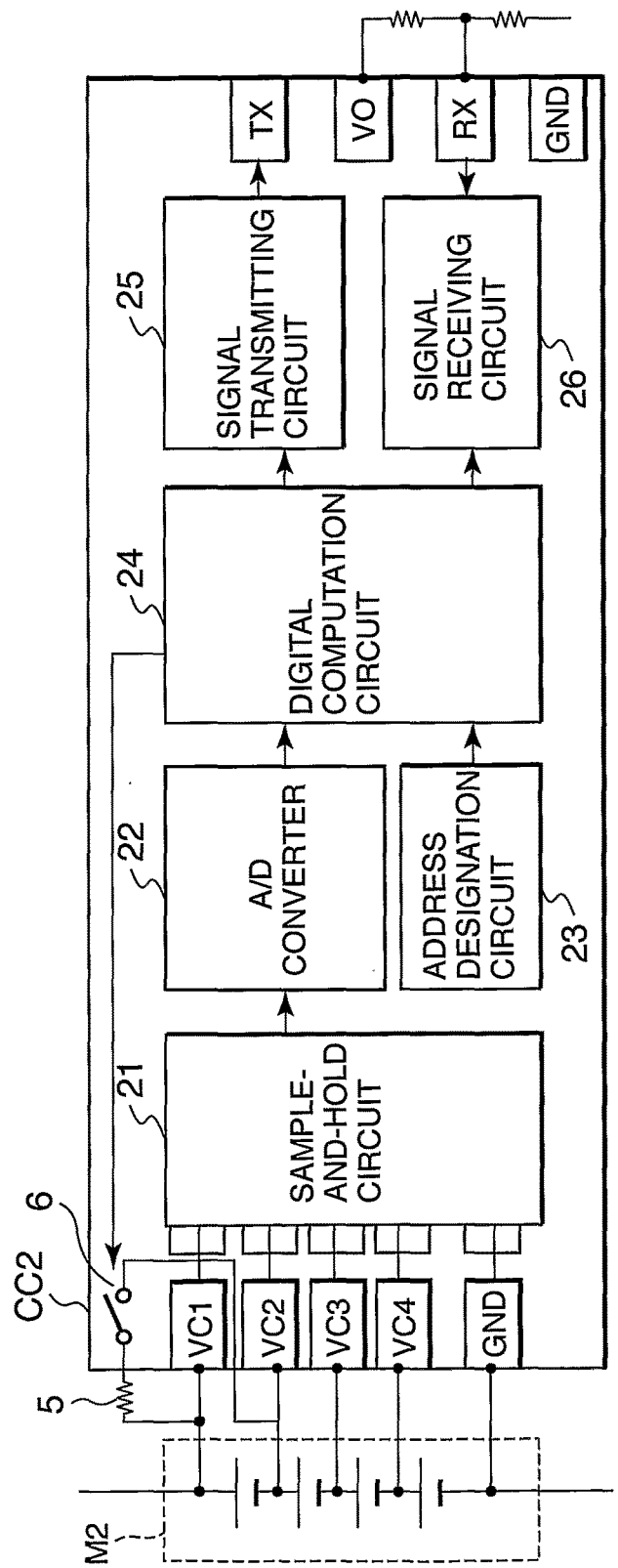
FIG. 2 is a block diagram of an integrated circuit CC2 according to this invention.

Referring to FIG. 2, a battery controller 10 outputs a command signal to the integrated circuits CC1-CC3 according to detected voltages of the unit cells 1 and lowers the output voltage of a unit cell 1 showing a high charge amount by closing a switching element 6 in the integrated circuits CC1-CC3 to supply power from the unit cell 1 to a charge amount regulating resistor 5. The charge amount regulating resistor 5 and the switching element 6 form a voltage-lowering unit.

FIG. 2 shows a pair of the charge amount regulating resistor 5 and the switching element 6 relating to one unit cell 1 only. In FIG. 1, the charge amount regulating resistor 5 and the switching element 6 are not shown. It should be noted however that the voltage lowering unit comprising the charge amount regulating resistor 5 and the switching element 6 is provided for each unit cell 1 in the battery modules M1, M2, M3.

Signals related to the output voltage of the battery group 3 are input into the battery controller 10. The vehicle is provided with a main controller 100 that controls an output torque of the electric motor 2 via the inverter on the basis of the signals input into the battery controller 10 relating to the output voltage of the battery group 3.

When the output voltage of the battery group 3 becomes low, the main controller 100 limits the output torque of the electric motor 2 via the inverter, thereby preventing the battery group 3 from over discharging. When the battery group 3 supplies power to another electric load in addition to the electric motor 2, the main controller 100 limits power consumption of the entire electric loads The main controller 100 and the battery controller 10 are constituted respectively by a microcomputer comprising a central processing unit (CPU), a read-only memory (ROM), a random access memory (RAM), and an input/output interface (I/O interface). The main controller 100 and the battery controller 10 may be constituted by a single microcomputer, or one or both of the main controller 100 and the battery controller 10 may be constituted by plural microcomputers.

Referring again to FIG. 2, the composition of the integrated circuit CC2 will be described. The composition of the integrated circuits CC1 and CC3 is identical to that of the integrated circuit CC2.

The integrated circuit CC2 comprises voltage input terminals VC1, VC2, VC3, VC4, into which the output voltage of each of four unit cells 1 constituting the battery module M2 are input, and a ground lug GRD. The integrated circuit CC2 further comprises a communication-output terminal TX, a communication power supply terminal VO, a communication-input terminal RX, and a ground lug GRD paired with the communication power supply terminal VO.

The communication-input terminal RX is connected to the communication-output terminal TX of the adjacent integrated circuit CC1. The communication-output terminal TX is connected to the communication-input terminal RX of the other adjacent integrated circuit CC3. The communication power supply terminal VO and the paired ground lug GRD are terminals for supplying electric power required for the communication-input terminal RX to receive signals output from the communication-output terminal TX of the integrated circuit CC1.

The integrated circuit CC2 further comprises a sample-and-hold circuit 21, an A/D converter 22, an address designation circuit 23, a digital computation circuit 24, a signal transmitting circuit 25, and a signal receiving circuit 26 to process the signals input into the terminals RX, TX, and VC1-VC4.

Referring again to FIG. 1, signals are input into the communication-input terminal RX of the integrated circuit CC3 located at a negative electrode side of the battery group 3 from an output terminal TDX, with which the battery controller 10 is provided, via a photo-coupler PC1. Signals output from the communication-output terminal TX of the integrated circuit CC1 located at a positive electrode side of the battery group 3 are input into an input terminal RDX, with which the battery group 3 is provided, via a photo-coupler PC2.

The reason why the integrated circuits CC1, CC3 and the battery controller 10 are not connected via an ordinary communication cable but via the photo-couplers PC2, PC1 is as follows. Specifically, the integrated circuits CC1-CC3 are connected to high voltage battery modules M1-M3, and hence the battery controller 10 and the integrated circuits CC1-CC3 should be electrically separated from each other so as to protect the battery controller 10 from a high-voltage current.

The photo-coupler PC1 comprises a photo-diode PD1 that is constituted by a light emitting element and generates an optical signal corresponding to an electrical signal input therein, and a photo transistor that is constituted by a light-sensitive element and generates an electrical signal corresponding to an optical signal input therein. The photo-diode PD1 is connected to the output terminal TDX of the battery controller 10 and outputs an optical signal corresponding to a command signal output from the battery controller 10. Upon receiving the optical signal, the photo-transistor PT1 converts the optical signal into an electrical signal and inputs it into the communication-input terminal RX of the integrated circuit CC3. Electric power required for the photo-diode PD1 to operate is supplied from the battery controller 10 and electric power required for the photo-transistor PT1 to operate is supplied from the integrated circuit CC3.

The photo-coupler PC2 comprises a photo-diode PD2 and a photo-transistor PT2. The photo-diode PD2 is connected to the communication-output terminal TX of the integrated circuit CC1. The photo-transistor PT2 is connected to an input terminal RXD of the battery controller 10. Electric power required for the photo-diode PD2 to operate is supplied from the battery controller 10. Electric power required for the photo-transistor PT2 to operate is supplied from the integrated circuit CC1.

The integrated circuits CC1, CC2, CC3 are thus connected to the battery controller 10 via a so-called cascade connection circuit. By adopting a cascade communication circuit, the number of costly photo-couplers PC1 and PC2 can be reduced in comparison with a case in which each of the integrated circuits CC1, CC2, CC3 has an independent connection with the battery controller 10.

Resistors R11, R12, R21, R22, R31, and R32 are required for the integrated circuits CC1-CC3 to communicate with the battery controller 10 or each other through the cascade communication circuit.

Referring again to FIG. 2, the sample-and-hold circuit 21 stores values of output voltages input into the voltage input terminals VC1-VC4 as analog signals. The A/D converter 22 converts the output voltage values of the unit cells 1 stored in the sample-and-hold circuit 21 into digital values. The address designation circuit 23 stores an inherent address assigned to the integrated circuit CC2.

The signal receiving circuit 26 receives signals input into the communication-input terminal RX.

The digital computation circuit 24 identifies the signals received by the signal receiving circuit 26 by referring to the inherent address stored in the address designation circuit 23 and performs various kinds of processing in accordance with an identification result.

Specifically, the digital computation circuit 24 identifies a voltage sampling and holding command signal directed to the integrated circuit CC2 from among the signals received by the signal receiving circuit 26. The digital computation circuit 24 then stores the output voltages of the unit cells 1 of the battery module M2 that the A/D converter 22 has converted into the digital values in an internal memory thereof in response to the identified voltage sampling and holding command signal.

The digital computation circuit 24 also identifies a transmission command signal directed to the integrated circuit CC2 from among the signals received by the signal receiving circuit 26. The digital computation circuit 24 then transmits the output voltage values of the unit cells 1 stored in the memory to the communication-output terminal TX via the transmitting circuit 25.

The digital computation circuit 24 further identifies an open/close signal of a switching element 6 for a specific unit cell 1 of the battery module M2 and then outputs a corresponding command signal to the switching element 6.

The digital computation circuit 24 transmits the signals received by the receiving circuit 26 to the communication-output terminal TX via the transmitting circuit 25 irrespective of the above identifications.

Referring again to FIG. 1, the battery voltage-monitoring device comprises the integrated circuits CC1-CC3 thus composed and connected in series via the cascade communication circuit to the battery controller 10. The battery controller 10 outputs the voltage sampling and holding command signal of the unit cells 1 from the output terminal TDX at a predetermined timing. The battery controller 10 also processes the signals input into the input terminal RXD.

Next, a prior art process for detecting the output voltages of the unit cells 1 of the battery modules M1-M3 will be described.

First of all, the battery controller 10 outputs the voltage sampling signal from the output terminal TDX via the photo-coupler PC1 to the communication-input terminal RX of the integrated circuit CC3.

Upon receiving the voltage sampling signal, the integrated circuit CC3 proceeds with a detection of the output voltages of the unit cells 1 of the battery module M3 connected to the integrated circuit CC3. The detected output voltages are output as voltage value signals from the communication-output terminal TX of the integrated circuit CC3 together with the voltage-sampling signal. The signals output from the integrated circuit CC3 are input into the input terminal RXD of the battery controller 10 via the integrated circuit CC2, the integrated circuit CC1, and the photo-coupler PC2. The voltage-sampling signal is transmitted to the integrated circuit CC2 at this timing.

Upon receiving the voltage sampling signal, the integrated circuit CC2 proceeds with a detection of the output voltages of the unit cells 1 of the battery module M2 connected to the integrated circuit CC2. The detected output voltages are output as voltage value signals from the communication-output terminal TX of the integrated circuit CC2 together with the voltage-sampling signal. The signals output from the integrated circuit CC2 are input into the input terminal RXD of the battery controller 10 via the integrated circuit CC1 and the photo-coupler PC2. The voltage-sampling signal is transmitted to the integrated circuit CC1 at this timing.

Upon receiving the voltage sampling signal, the integrated circuit CC1 proceeds with a detection of the output voltages of the unit cells 1 of the battery module M1 connected to the integrated circuit CC1. The detected output voltages are output as voltage value signals from the communication-output terminal TX of the integrated circuit CC1 together with the voltage-sampling signal. The signals output from the integrated circuit CC1 are input into the input terminal RXD of the battery controller 10 via the photo-coupler PC2.

The detecting process for detecting the output voltages of the unit cells 1 of the battery modules M1-M3 described above is a typical prior art process performed by a battery voltage monitoring device comprising integrated circuits connected by a cascade communication circuit.

In this process, a time lag occurs inevitably in the detection timings of the output voltage values of the unit cells 1 depending on the battery modules M1-M3. If the battery controller 10 handles the output voltage values of the unit cells 1 of the battery modules M1-M3 thus obtained as substantially simultaneously detected output voltage values, errors are likely to be introduced between the detected values and the real values.

The time lag with respect to detection of the output voltages of the unit cells 1 is especially prominent in the integrated circuit CC1, which is located at a downstream end of the cascade communication circuit.

When the battery controller 10 commands that the output voltages of the battery modules M1-M3 be detected and transmitted to the battery controller 10 via a cascade communication circuit, the command signal from the battery controller 10 is first input into the integrated circuit CC3 at the upstream end via the photo-coupler PC1.

Upon receiving the command signal, the integrated circuit CC3 detects the output voltages of the unit cells 1 in the corresponding battery module M3. The detected voltages are written into the signal and output from the integrated circuit CC3. The voltages of the unit cells 1 in the battery module M3 are thus detected and transmitted from the integrated circuit CC3. Next, the command signal transmitted from the integrated circuit CC3 is received by the integrated circuit CC2. As in the case of the integrated circuit CC3, the integrated circuit CC2 detects the output voltages of the unit cells 1 in the corresponding battery module M2. The detected voltages are written into the signal, which was received by the integrated circuit CC2, and output to the integrated circuit CC1 at the downstream end.

The signal thus transmitted via the cascade communication circuit includes the output voltage data of the unit cells 1 in each battery module M1-M3 and is finally output to the battery controller 10 via the photo-coupler PC2. The battery controller 10, by receiving this signal, completes detection and read-in of the voltages of the unit cells 1 in the battery modules M1-M3.

When detection and transmission of the output voltages of the unite cells in the battery modules M1-M3 are performed through such a cascade communication system, it is inevitable that the battery modules M1-M3 perform detection of the output voltages of the unit cells 1 at different timings. Errors may be introduced into the output voltage data of the unit cells 1 due to a time lag in detection timings of the output voltages of the unit cells 1 in the battery modules M1-M3. These errors may adversely affect the precision of the detected output voltages of the unit cells 1.

The time lag becomes greater as the number of battery modules connected in series increases, or in other words the stages of cascade connection increases.

The battery voltage monitoring device according to this invention prevents errors caused by a time lag during detection timings from occurring in detection of the output voltages of the unit cells of the battery modules M1-M3 by causing the integrated circuits CC1-CC3 to sample and hold the output voltages of the unit cells 1 of the battery modules M1-M3 independently and substantially simultaneously.

To realize such an operation of the monitoring device, the battery controller 10 first transmits the voltage sampling and holding command signal to the integrated circuit CC3 at the upstream end such that the voltage sampling and holding command signal be transmitted to each of the integrated circuits CC1-CC3 via the cascade communication circuit. The voltage sampling and holding command signal commands that output voltages of the unit cells 1 be sampled and held in the integrated circuits CC1-CC3. The battery controller 10 then outputs the transmission command signal to the integrated circuit CC3 at the upstream end such that the transmission command signal be transmitted via the cascade communication circuit to each of the integrated circuits CC1-CC3 after transmitting the voltage sampling and holding command signal. The transmission command signal commands that the output voltage values held by the integrated circuits CC1-CC3 be transmitted to the battery controller 10.

The operation to transmit the output voltage values of the unit cells 1 to the battery controller 10 takes time. The monitoring device therefore separates a process for sampling and holding the output voltages of the unit cells 1 from a process for transmitting the output voltage values held by the integrated circuits CC1-CC3 to the battery controller 10 so that the former process can be performed substantially simultaneously by the integrated circuits CC1-CC3.

Figure 3A:
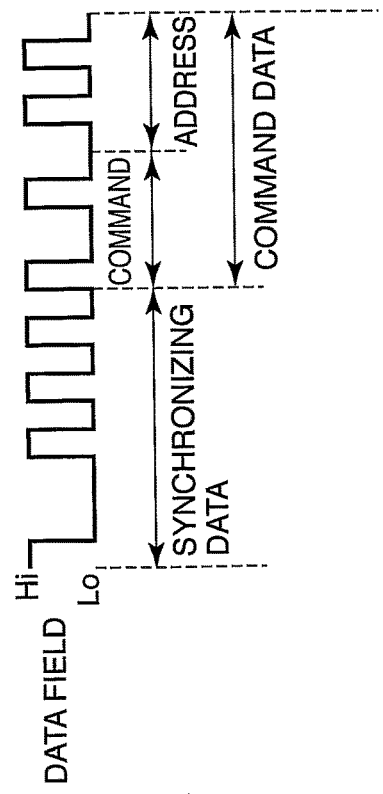
FIGS. 3A and 3B are timing charts showing a structure of data transmitted from a battery controller to an integrated circuit CC3 and a structure of data transmitted from the integrated circuit CC3 to the integrated circuit CC2 according to this invention.
Figure 3B:
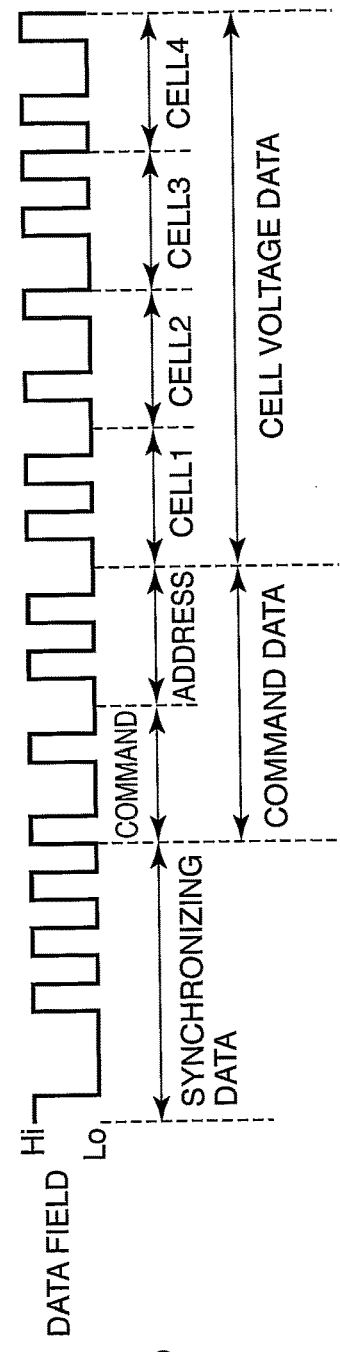
Figure 4:
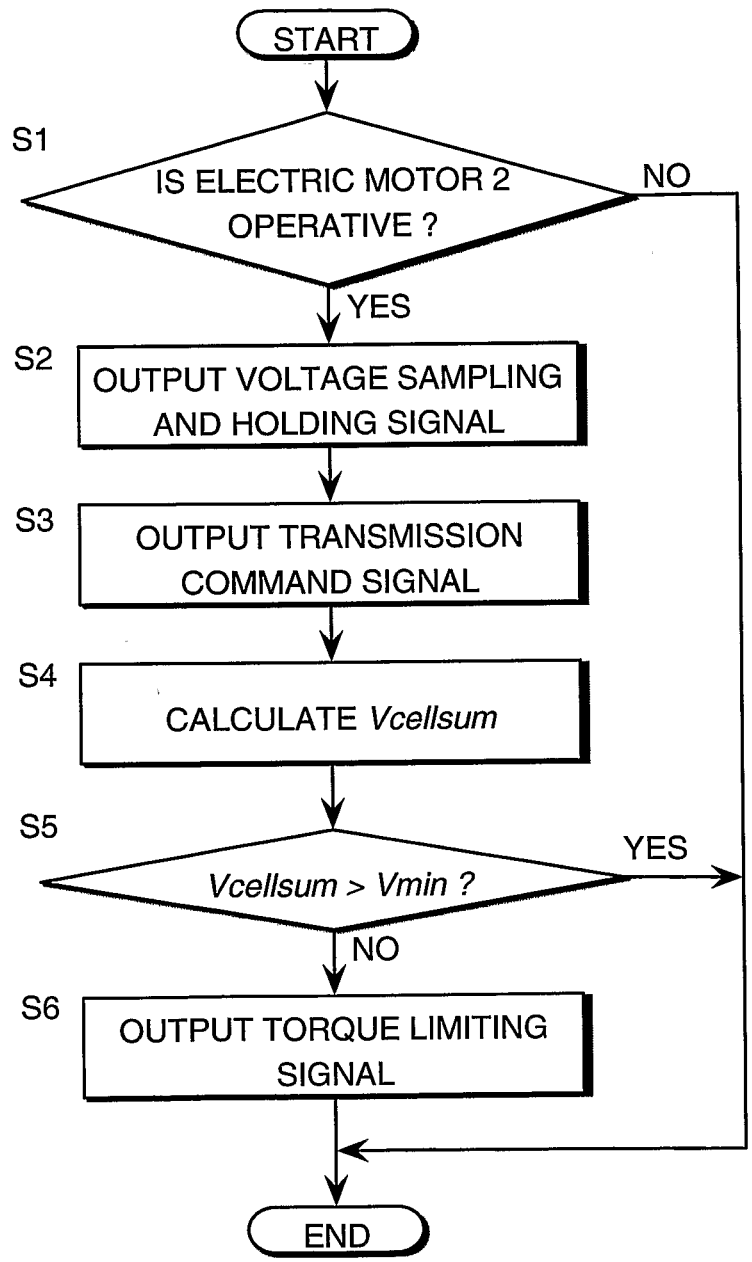
FIG. 4 is a flowchart describing a routine for determining an output voltage of a battery group, performed by the battery controller according to this invention.

Referring to FIGS. 3A, 3B and FIG. 4, determination of the output voltage of the battery group 3 and control of the output torque of the electric motor 2 on the basis of the determination result will be described.

FIG. 3A shows a structure of data transmitted from the battery controller 10 to the integrated circuit CC3. FIG. 3B shows a structure of data transmitted from the integrated circuit CC3 to the integrated circuit CC2.

As shown in the figure, the voltage sampling and holding command signal that the battery controller 10 outputs to the integrated circuit CC3 comprises synchronizing data and command data. The command data includes a command and address information relating to the unit cells 1 whose output voltages are to be detected.

The integrated circuit CC3 transmits the voltage sampling and holding command signal input into the communication-input terminal RX of the integrated circuit CC3 from the battery controller 10, to the communication-input terminal RX of the integrated circuit CC2 from the communication-output terminal TX without modification. The integrated circuit CC3 identifies the voltage sampling and holding command signal also as a signal directed to the integrated circuit CC3 and stores the output voltage values of the unit cells 1 of the battery module M3, which are input into the voltage input terminals VC1-VC4 of the integrated circuit CC3, into the memory of the digital computation circuit 24.

Similarly, the integrated circuit CC2 transmits the voltage sampling and holding command signal input into the communication-input terminal RX of the integrated circuit CC2 from the integrated circuit CC3, to the communication-input terminal RX of the integrated circuit CC1 from the communication-output terminal TX without modification. The integrated circuit CC2 identifies the voltage sampling and holding command signal also as a signal directed to the integrated circuit CC2 and writes the output voltages of the unit cells 1 of the battery module M2, which are input into the voltage input terminals VC1-VC4 of the integrated circuit CC2, into the memory of the digital computation circuit 24.

Also similarly, the integrated circuit CC1 transmits the voltage sampling and holding command signal input into the communication-input terminal RX of the integrated circuit CC1 from the integrated circuit CC2, to the input terminal RXD of the battery controller 10 from the communication-output terminal TX via the photo-coupler PC2 without modification. The integrated circuit CC1 identifies the voltage sampling and holding command signal also as a signal directed to the integrated circuit CC1 and write the output voltages of the unit cells 1 of the battery module M1, which are input into the voltage input terminals VC1-VC4 of the integrated circuit CC1, into the memory of the digital computation circuit 24.

The battery controller 10 determines that the voltage sampling and holding command signal has been transmitted to the integrated circuit CC1, which is located at the downstream end of the cascade communication circuit, by receiving the voltage sampling and holding command signal transmitted from the integrated circuit CC1 via the photo-coupler PC2.

Following this determination, the battery controller 10 outputs the transmission command signal to the integrated circuit CC3.

The integrated circuit CC3, in response to the transmission command signal received at the communication-input terminal RX, outputs response signals CELL1-CELL4 containing the output voltage values of the unit cells 1 of the battery module M3 that are stored in the memory of the digital computation circuit 24 from the communication-output terminal TX.

The response signal CELL1 contains the output voltage value of the unit cell 1 connected to the voltage input terminal VC1 of the integrated circuit M3. The response signal CELL2 contains the output voltage value of the unit cell 1 connected to the voltage input terminal VC2 of the integrated circuit M3. The response signal CELL3 contains the output voltage value of the unit cell 1 connected to the voltage input terminal VC3 of the integrated circuit M3. The response signal CELL4 contains the output voltage value of the unit cell 1 connected to the voltage input terminal VC4 of the integrated circuit M3.

Referring to FIG. 3B, the transmission command signal comprises synchronizing data and command data as in the case of the voltage sampling and holding command signal shown in FIG. 3A. However, the command data of the transmission command signal are different from those of the voltage sampling and holding command signal.

Similarly, the integrated circuit CC2 and the integrated circuit CC1 respectively output the response signals CELL1-CELL4 from the communication-output terminal TX thereof in response to the transmission command signal.

As described above, in this monitoring device, the voltage sampling and holding command signal is transmitted to all of the integrated circuits CC1-CC3, and the integrated circuits CC1-CC3 detect the output voltages of the unit cells 1 and store the output voltage values in the memory of the digital computation circuit 24. This operation is performed by each of the integrated circuits CC1-CC3 in parallel and substantially synchronously.

The integrated circuits CC1-CC3 then output the output voltage values stored in the memory of the respective digital computation circuits 24 from the communication-output terminal TX in response to the transmission command signal.

Accordingly, detection of the output voltage values of the unit cells 1 is performed prior to transmission of the detected output voltage values by the integrated circuit located on the upstream side of the cascade connection circuit. Transmission of the detected output voltage values from an integrated circuit located on the upstream side of the cascade connection circuit does not cause a delay in detection of the output voltages of the unit cells 1 by an integrated circuit located downstream. As a result, detection of the output voltages of the unit cells 1 is performed substantially simultaneously in all of the battery modules M1-M3.

Referring to FIG. 4, a routine performed by the battery controller 10 for determining an output voltage of the battery group 3 on the basis of the output voltages of the unit cells 1 of the battery modules M1-M3 will be described. This routine is performed repeatedly at regular time intervals of 40 msec, for example, irrespective of vehicle conditions.

In a step S1, the battery controller 10 determines if the electric load including the electric motor 2 is operative. When the determination is negative, the battery controller 10 immediately terminates the routine.

When, on the other hand, the determination is affirmative, the battery controller 10 outputs the voltage sampling and holding command signal to the integrated circuit CC3 in a step S2. The integrated circuits CC1-CC3, when receiving the voltage sampling and holding command signal, write the values of the output voltages of the unit cells 1 input into the voltage input terminals VC1-VC4 into the memory of the digital computation circuit 24, respectively.

In the step S3, the battery controller 10 outputs the transmission command signal to the integrated circuit CC3. The integrated circuits CC1-CC3, in response to the transmission command signal, transmit respectively the values of the output voltages of the unit cells 1 stored in the memory to the battery controller 10 as the response signals CELL1-CELL4.

Having received the response signals CELL1-CELL4 from the integrated circuits CC1-CC3, the battery controller 10 calculates a total value Vcellsum of the output voltages of the unit cells 1 of the battery module M1-M3.

In a step S4, the battery controller 10 reads the total value Vcellsum of the output voltages of the unit cells 1 of the battery module M1-M3.

In a next step S5, the battery controller 10 compares the total value Vcellsum with a predetermined threshold value Vmin. The threshold value Vmin is a reference value for determining if the charge amount of the battery group 3 is sufficient. When the total value Vcellsum is greater than the threshold value Vmin, the battery controller 10 terminates the routine immediately. In this case, the charge amount of the battery group 3 is determined to be sufficient and no limitation is applied to the output torque of the electric motor 2.

When, on the other hand, the total value Vcellsum is not greater than the threshold value Vmin in the step S5, the battery controller 10 outputs an output torque limiting signal to the main controller 100 in a step S6.

Upon receiving the output torque limiting signal, the main controller 100 limits the output torque of the electric motor 2 not to exceed a set torque limitation by controlling the inverter, which is connected to the electric motor 2. As a result, over discharge of the battery group 3 does not occur even when a driver of the vehicle depresses an accelerator pedal.

The monitoring device according to this invention separates the voltage sampling and holding command signal from the transmission command signal as described above. As a result, the integrated circuits CC1-CC3 sample and hold the output voltages of the unit cells 1 substantially in synchronism in response to the voltage sampling and holding command signal. The values of the output voltages of the unit cells 1 stored in the memory are output to the battery controller 10 only when the integrated circuits CC1-CC3 receive the transmission command signal. Performing detection of the output voltages of the unit cells 1 and transmission thereof in this way, a lag time in the detection timings of the output voltages of the unit cells 1 of the battery modules M1-M3 is reduced by a large amount. By reducing the lag time, the total value Vcellsum of the output voltages of the unit cells 1 can be calculated with precision.

Assuming that the number of the unit cells 1 constituting one battery modules is N and the total number of the unit cells 1 of the battery group 3 constituted by the battery modules is M, the number of the battery modules is represented by M/N. Assuming that the integrated circuit transmits the voltage sampling signal to the adjacent integrated circuit connected via the cascade communication circuit after outputting the detected voltage values of the unit cells 1 as in the case of the prior art process and that twenty milliseconds (20 msec) are required for each integrated circuit to detect the output voltage of the unit cells 1 of the relevant battery module, the time required for the processing corresponding to the steps S2 and S3 in FIG. 4 is 20×M/N (msec). In this case, a time lag nearly equal to 20×M/N (msec) appears between the integrated circuit at the upstream end of the cascade communication circuit and the integrated circuit at the downstream end thereof during detection of the output voltages of the unit cells 1.

In this monitoring device, since the voltage sampling and holding command signal and the transmission command signal are generated separately, the output voltage detection timings of the unit cells 1 in the battery modules M1-M3 are almost the same. According to this monitoring device, therefore, a prominent effect is obtained in suppression of a time lag. In a transient state of the vehicle such as vehicle startup, the electric load varies rapidly. Suppressing the time lag increases the precision with which the charge amount of the battery group 3 is detected. A loading state of the battery group 3 is thereby controlled precisely in the transient state of the vehicle.

When the monitoring device according to this invention is applied to a hybrid drive electric vehicle, the monitoring device can also be used for control of regenerative power charging.

Specifically, the main controller 100 controls the charging operation of the battery group 3 via the inverter such that the battery group 3 is charged using power generated by the electric motor 2 when regenerative braking of the vehicle is performed. For this purpose, the battery controller 10 compares the total value Vcellsum of the output voltages of the unit cells 1 with a predetermined threshold value Vmax. If the total value Vcellsum is lower than the threshold value Vmax, the battery controller 10 determines that the battery group 3 can be charged further and outputs a signal to the main controller 100 to continue charging the battery group using power generated by regenerative braking. If, on the other hand, the total value Vcellsum of the output voltages of the unit cells 1 is not lower than the threshold value Vmax, the battery controller 10 determines that the battery group 3 may be subjected to over-charge and outputs a charge stop signal to the main controller 100.

As described above, this monitoring device brings about a preferable effect in the prevention of over-discharging of the battery group 3 as well as in the prevention of over-charging of the battery group 3.

In the step S5, the battery controller 10 compares the total value Vcellsum of the output voltages of the unit cells 1 with the threshold value Vmin to determine the charge amount of the battery group 3. The determination of the charge amount of the battery group 3 can be performed using various parameters other than the total value Vcellsum of the output voltages of the unit cells 1. For example, the charge amount of the battery group 3 can be determined on the basis of an output voltage of a specific unit cell 1, or it can be determined on the basis of a maximum value or a minimum value among the output voltage values of the battery modules M1-M3.

The relay 4 functions as a main switch causing all the electric loads including the electric motor 2 and an air conditioner to be ready to operate. It should be noted that the electric loads do not operate with only the relay 4 ON, but operate when they receive an operation command signal from the main controller 100.

When the relay 4 is ON but the electric loads are not operative, the output voltages of the unit cells 1 of the battery modules M1-M3 under no load are detected by the execution of the routine. The output torque of the electric motor 2 is then controlled on the basis of the detected output voltage values in the step S6. It is possible therefore to limit the output torque of the electric motor 2 before it starts to operate. This limitation prevents the battery group 3 from over-discharging by causing the electric motor 2 to start operating while the state of charge of the battery group 3 is low.

Further, if a power source for operating the battery controller 10 and the integrated circuits CC1-CC3 is provided separately, it is possible to detect the output voltages of the unit cells 1 even when the relay 4 is in the OFF state. In this case, the charge amount of the battery group 3 may be detected preceding the relay 4 that is switched to the ON state, thereby limiting the output torque of the electric motor 2 about to operate in advance.

Figure 5:
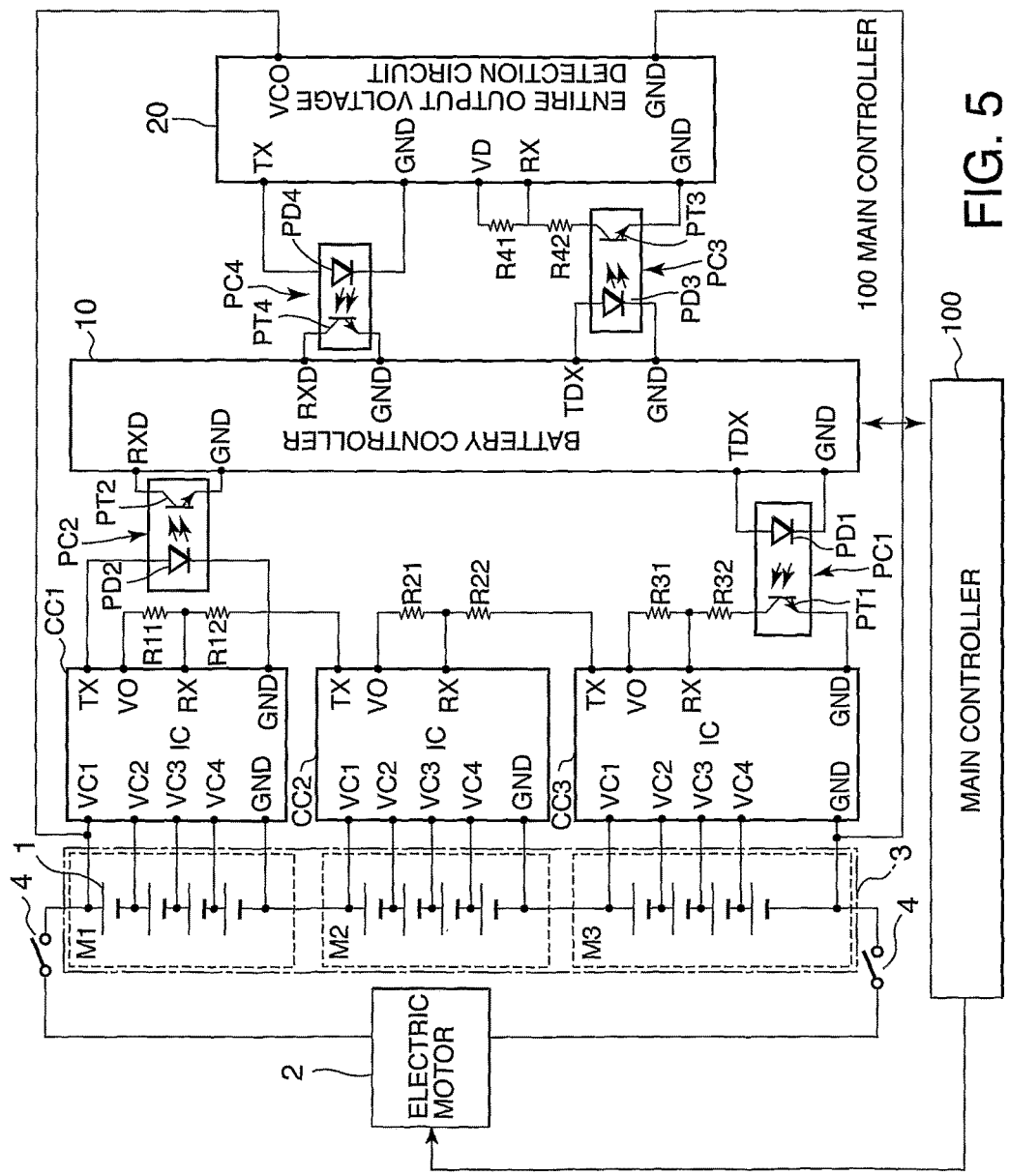
FIG. 5 is an electric circuit diagram of a battery voltage-monitoring device according to a second embodiment of this invention.
Figure 6:
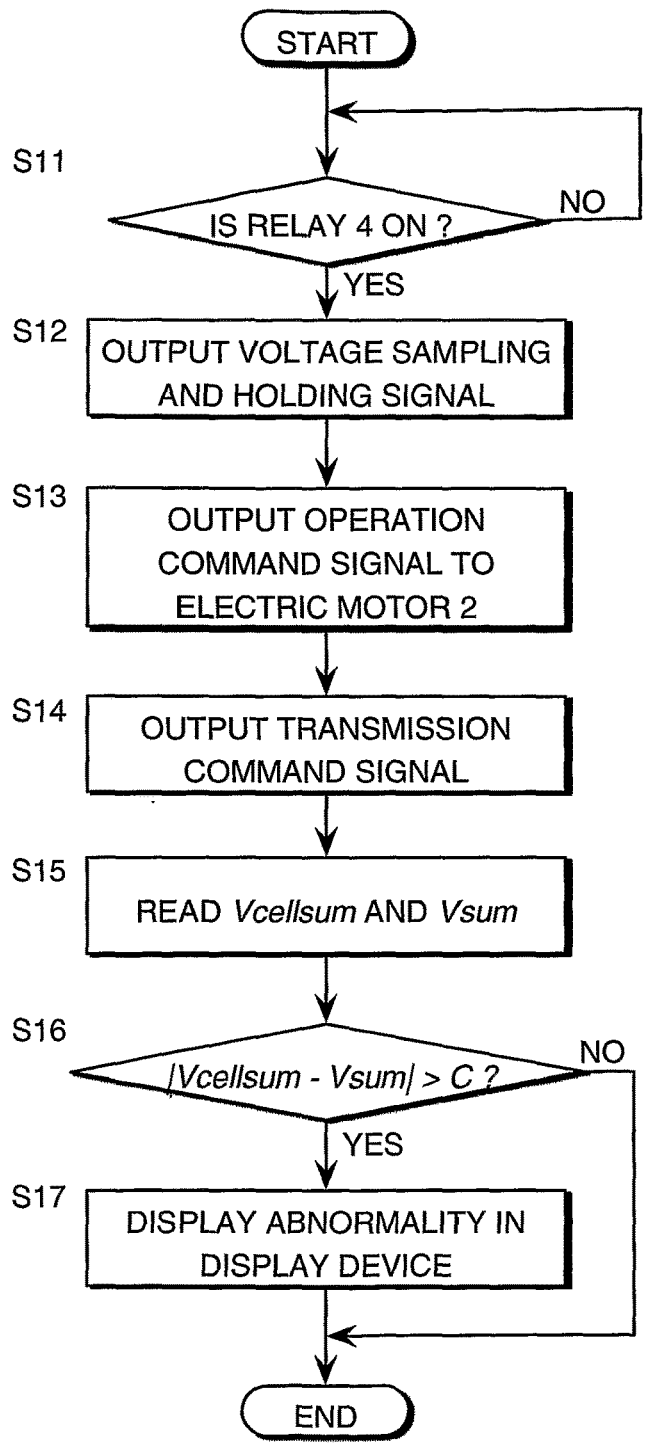
FIG. 6 is a flowchart describing an abnormality determination routine relating to integrated circuits performed by a battery controller according to the second embodiment of this invention.

Referring to FIGS. 5 and 6, a second embodiment of this invention will be described.

This embodiment differs from the first embodiment in that the monitoring device comprises an entire output voltage detection circuit 20 and the battery controller 10 performs an abnormality determination routine on the integrated circuits CC1-CC3 instead of the output voltage determining routine performed on the battery group 3.

Referring to FIG. 5, the entire output voltage detection circuit 20 is connected to terminals provided at both electrical ends of the battery group 3 so as to detect the output voltage of the battery group 3 directly. The entire output voltage detection circuit 20 is constituted by an integrated circuit similarly to the integrated circuits CC1-CC3 and is provided with a digital computation circuit having a memory to store a value of an entire output voltage of the battery group 3. The entire output voltage detection circuit 20 is connected to the battery controller 10 via a photo-coupler PC3 and a photo-coupler PC4.

Referring to FIG. 6, an abnormality determination routine of the integrated circuits CC1-CC3 will be described. This routine is performed by the battery controller 10 on the basis of the entire output voltage of the battery group 3 and the output voltages of the unit cells 1 of the battery modules M1-M3. Unlike the routine of FIG. 4, this routine is performed only once when the vehicle starts to operate.

In this embodiment, power for operating the battery controller 10 is supplied permanently without passing through the relay 4.

In a step S11, the battery controller 10 determines if the relay 4 is in an ON state.

When the relay 4 is not in the ON state, the battery controller 10 waits until the relay 4 is switched to the ON state.

When the relay 4 is in the ON state, the battery controller 10 outputs a voltage sampling and holding command signal to the integrated circuits in a step S12. It also outputs a voltage sampling and holding command signal to the entire output voltage detection circuit 20. The voltage sampling and holding command signal output to the entire output voltage detection circuit 20 does not necessarily comprise address information, because the entire output voltage detection circuit 20 is connected to the battery controller 10 via an independent signal circuit. Upon receiving the voltage sampling and holding command signal, the integrated circuits CC1-CC3 detect the output voltages of the unit cells 1 of the battery modules M1-M3 connected thereto and stores the detected output voltage values in the memory of the respective digital computation circuits 24. Upon receiving the voltage sampling and holding command signal, the entire output voltage detection circuit 20 detects the entire output voltage of the battery group 3 and stores the detected entire output voltage value in the memory of the digital computation circuit.

The voltage sampling and holding command signal output to the integrated circuit CC1 is finally input into the battery controller 10 from the integrated circuit CC3 via the photo-coupler PC2. By recognizing the input of the voltage sampling and holding command signal, the battery controller 10 determines that transmission of the voltage sampling and holding command signal to the integrated circuits CC1-CC3 is complete.

After determining that transmission of the voltage sampling and holding command signal to the integrated circuits CC1-CC3 is complete, the battery controller 10 outputs an operation command signal to the electric motor 2 in a step S13. The electric motor 2 thereby starts operating using the power supplied from the battery group 3.

In a following step S14, the battery controller 10 outputs a transmission command signal to the integrated circuit CC3 and the entire output voltage detection circuit 20. The battery controller 10 then reads the output voltage values of the unit cells 1 that are transmitted from the integrated circuits CC1-CC3 in response to the transmission command signal and the entire output voltage value Vsum of the battery group 3 that is transmitted from the entire output voltage detection circuit 20 in response to the transmission command signal. The battery controller 10 calculates the total value Vcellsum of the output voltages of the unit cells 1 as in the case of the step S3 of the first embodiment. The result of this calculation is stored in the memory of the battery controller 10.

In a step S15, the battery controller 10 reads the total value Vcellsum of the output voltages of the unit cells 1 and the entire output voltage Vsum of the battery group 3.

In a step S16, the battery controller 10 determines if an absolute value of a difference between the total value Vcellsum of the output voltages of the unit cells 1 and the entire output voltage Vsum of the battery group 3 is greater than a constant value C.

If the integrated circuits CC1-CC3 and the entire output voltage detection circuit 20 do not exhibit an abnormality, the value of Vcellsum and the value of Vsum should be substantially equal. The constant value C is set in the vicinity of a maximum error that may occur during voltage detection. When the determination in the step S16 negative, it is determined that the integrated circuits CC1-CC3 are operating normally.

However, when the absolute value of the difference between the total value Vcellsum of the output voltages of the unit cells 1 and the entire output voltage Vsum is not greater than the constant value C, the battery controller 10 immediately terminates the routine without proceeding to other steps.

When, for example, the digital computation circuit 24 of the integrated circuit CC2 is defective, the integrated circuit CC2 cannot hold the output voltages of the unit cells 1 of the battery module M2 in the digital computation circuit 24. As a result, nil values are transmitted from the integrated circuit CC2 to the battery controller 10 in response to the transmission command signal.

In this case, a great difference appears between the total value Vcellsum of the output voltages of the unit cells 1 and the entire output voltage Vsum of the battery group 3. When the absolute value of the difference is greater than the constant value C, the battery controller 10 indicates on a display device that abnormality exists in at least one of the integrated circuits CC1-CC3 or the entire output voltage detection circuit 20 in a step S17.

Since the battery controller 10 can calculate a total value of the output voltages of the unit cells 1 of each of the battery modules M1-M3 from the input signals, it is possible for the battery controller 10 to specify which integrated circuit is defective. Further, the battery controller 10 may take a fail-safe measure via the main controller 100 such as prohibiting operations of the electric motor 2, as well as indicating an abnormality in the integrated circuits in the step S17.

According to this embodiment, with respect to detection of the output voltages of the unit cells 1, output of the voltage sampling and holding command signal and output of the transmission command signal to the integrated circuit CC3 are performed in separate processes, as in the case of the first embodiment. According to this embodiment also, the time lag in detection of the output voltages of the unit cells 1 is eliminated and an increase is achieved in the precision with which the total value Vcellsum of the output voltages of the unit cells 1 is detected. By simply applying the entire output voltage detection circuit 20 to the monitoring device of the first embodiment, this embodiment can perform an abnormality determination on the integrated circuits CC1-CC3 with precision as well as performing output torque control of the electric motor 2.

In this embodiment, the abnormality determination routine relating to the integrated circuits CC1-CC3 is performed by the battery controller 10. However, it is possible to configure the main controller 100 to perform the abnormality determination routine in place of the battery controller 10.

Referring to FIG. 7, FIGS. 8A, 8B, FIGS. 9A, 9B, and FIG. 10, a third embodiment of this invention will be described.

This embodiment is applied to a hybrid drive electric vehicle. The hybrid drive electric vehicle comprises two motive power sources, i.e. an electric motor 2 and an internal combustion engine. Herein, the electric motor 2 also functions as a starter motor for the internal combustion engine.

Figure 7:
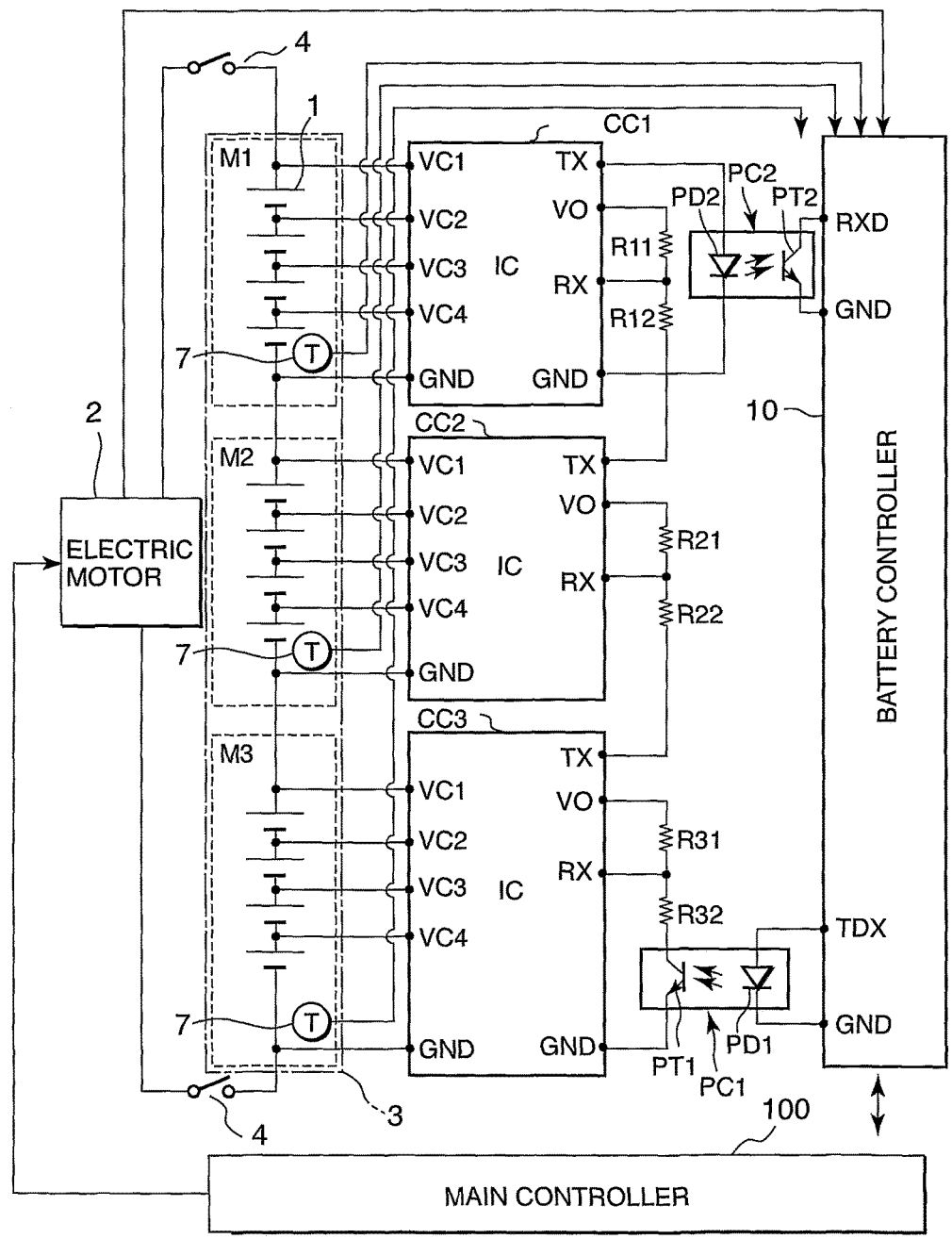
FIG. 7 is an electric circuit diagram of a battery voltage-monitoring device according to a third embodiment of this invention.

Referring to FIG. 7, the monitoring device comprises temperature sensors 7 that detect an atmospheric temperature of the battery modules M1-M3. Temperatures detected by the temperature sensors 7 are input into the battery controller 10 as signals via an independent signal circuit.

A cranking signal indicating that the electric motor 2 is operative, or in other words indicating cranking of the internal combustion engine, is input into the battery controller 10 from the electric motor 2.

Figure 10:
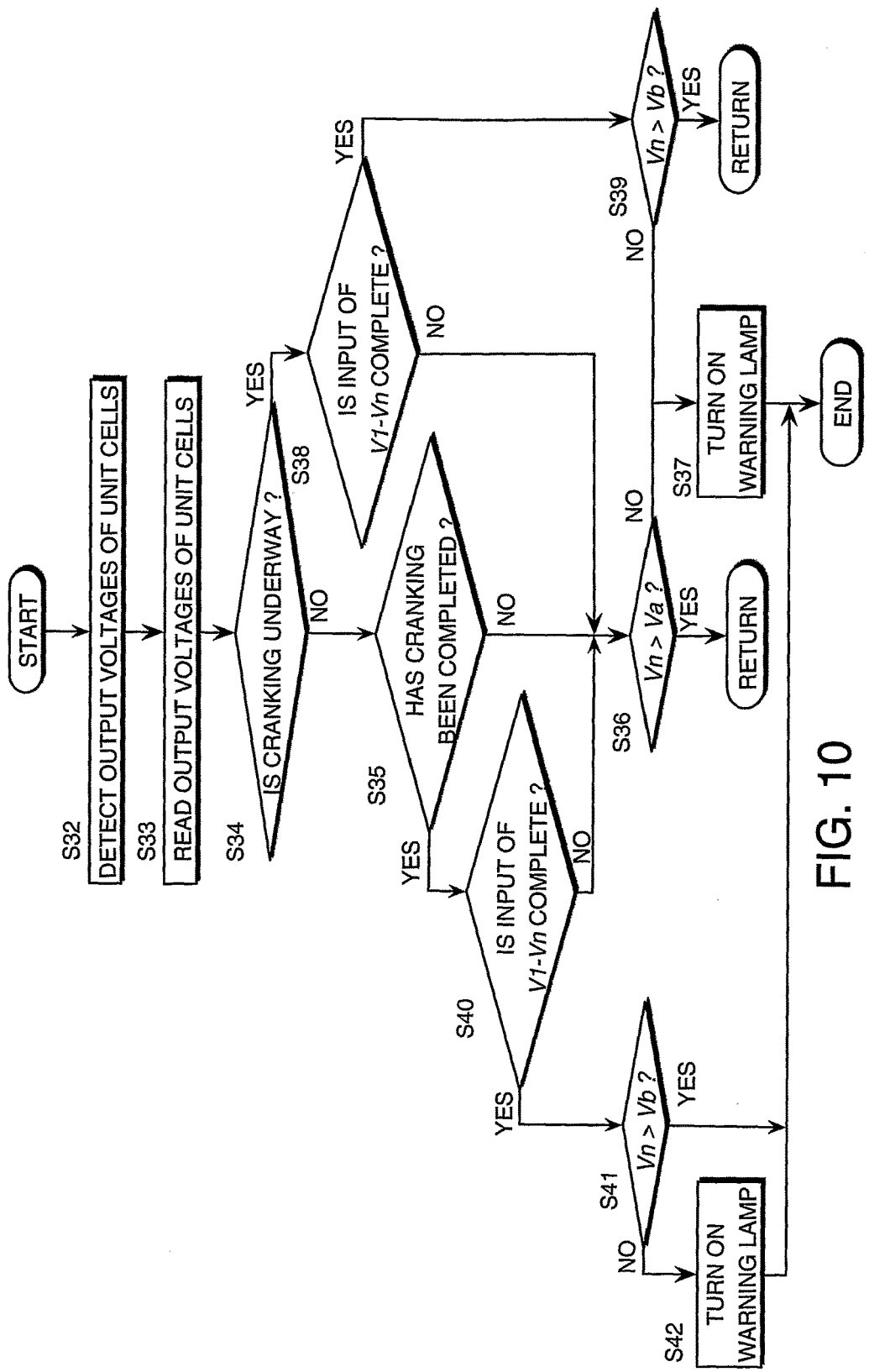
FIG. 10 is a flowchart describing an abnormality determination routine of unit cells performed by the battery controller according to the third embodiment of this invention.

On the basis of these signals, the battery controller 10 performs a battery module abnormality determination routine shown in FIG. 10.

The monitoring device stores output voltages of the unit cells 1 input into the voltage input terminals VC1-VC4 of the integrated circuits CC1-CC3 in the memory of the digital computation circuits 24 of the respective integrated circuits CC1-CC3 in response to a voltage sampling and holding command signal output from the battery controller 10, as in the case of the first embodiment. The monitoring device transmits the stored output voltage values of the unit cells 1 to the battery controller 10 in response to a transmission command signal output from the battery controller 10.

The battery controller 10 turns on a warning lamp when any of the output voltages of the unit cells 1 is lower than or equal to a predetermined first over-discharge threshold voltage Va or a second over-discharge threshold voltage Vb depending on a load condition of the battery group 3.

The first over-discharge threshold voltage Va is a threshold value for determining an abnormality in the output voltages of the unit cells 1 in a no load state. The second over-discharge threshold voltage Vb is a threshold value for determining an abnormality in the output voltages of the unit cells 1 in a loaded state under a low temperature. Herein, the no load state denotes a state where cranking of the internal combustion engine is not performed while the loaded state denotes a state where cranking of the internal combustion engine is performed in a low temperature state.

When an electrical load is exerted on the unit cells 1 in a low temperature state, in which an internal resistance of the unit cells 1 is large, the unit cells 1 discharge a large power current. As a result, the unit cells 1 show a significant voltage drop. Considering such a situation, the second over-discharge threshold voltage Vb is set at a lower value than the first over-discharge threshold voltage Va.

The battery controller 10 determines if there is an abnormality in the output voltage of any of the unit cells 1 by selectively applying the first over-discharge threshold voltage Va and the second over-discharge threshold voltage Vb according to the temperature and load conditions and turns on the warning lamp according to the determination result.

Since this monitoring device employs a cascade communication circuit for communication between the respective integrated circuits CC1-CC3 and the battery controller 10, a total time period required for each of the integrated circuits CC1-CC3 to detect the output voltages of the unit cells 1 and store the detected output voltage values in the memory is shorter than a total time period required for the integrated circuits CC1-CC3 to transmit the stored output voltage values to the battery controller 10. In a hybrid drive electric vehicle, the main controller 100 outputs a cranking command relating to the internal combustion engine to the electric motor 2 and the electric motor 2 starts cranking the internal combustion engine in response to the cranking command.

During a time period from output of the cranking command until cranking of the internal combustion engine is actually started, the battery controller 10 compares the output voltages V1-Vn of the unit cells 1 with the first over-discharge threshold voltage Va. When the output voltage of any of the unit cells 1 is lower than or equal to the first over-discharge threshold voltage Va, the battery controller 10 determines that the relevant unit cell 1 is abnormal and turns on the warning lamp.

During a time period in which cranking of the internal combustion engine is underway, the battery controller 10 compares the output voltages V1-Vn of the unit cells 1 with the second over-discharge threshold voltage Vb. When the output voltage of any of the unit cells 1 is lower than or equal to the second over-discharge threshold voltage Vb, the battery controller 10 determines that the relevant unit cell 1 is abnormal and turns on the warning lamp.

When cranking of the internal combustion engine is complete, the battery controller 10 again compares the output voltage V1-Vn of the unit cells 1 with the first over discharge threshold voltage Va. When the output voltage of any of the unit cells 1 is lower than or equal to the first over discharge threshold voltage Va, the battery controller 10 determines that the relevant unit cell 1 is abnormal and turns on the warning lamp.

Circled numbers from 1 to N in FIGS. 8A, 8B and FIGS. 9A, 9B denote an order of detection of the output voltages of the unit cells 1. The circled number 1 denotes the output voltage V1 of the unit cell 1 located nearest to the negative electrode of the battery group 3 in FIG. 7 while the circled number N denotes the output voltage Vn of the unit cell 1 located nearest to the positive electrode of the battery group 3. In the timing charts of FIGS. 8B and 9B, the ordinate represents voltage while the abscissa represents time. The integrated circuits CC1-CC3 detect the output voltages of the unit cells 1 and store the detected voltage values in the memory in the digital computation circuit 24 in response to the voltage sampling and holding command signal that the battery controller 10 outputs in every cycle period T. The integrated circuits CC1-CC3 transmit the stored voltage values to the battery controller 10 in response to the transmission command signal that the battery controller 10 outputs separately from the voltage sampling and holding command signal in every cycle period T.

Referring to FIG. 10, an abnormality determination routine relating to the unit cells 1, which is performed by the battery controller 10 will be described. The battery controller 10 repeatedly performs this routine at regular intervals of, for example, ten milliseconds, when the power supply to the battery controller 10 is ON.

Since this routine is assumed to be performed in a low temperature condition, a specific temperature-determining step is not provided. The battery controller 10 may determine if the present condition corresponds to a predetermined low temperature condition on the basis of the temperature detected by the temperature sensors 7 and perform the routine only when the present condition corresponds to the low temperature condition. However, it is possible to perform the routine irrespective of temperature conditions.

In the step S32, the battery controller 10 outputs the voltage sampling and holding command signal to the integrated circuit CC3. The integrated circuits CC1-CC3 store the output voltages of the unit cells 1 input into the voltage input terminals VC1-VC4 in the memory of the digital computation circuit 24 as digital values in response to the voltage sampling and holding command signal as described hereintofore.

In a next step S33, the battery controller 10 outputs a transmission command signal to the integrated circuit CC3. The integrated circuits CC1-CC3 transmit the stored voltage values to the battery controller 10 in the form of signals CELL1-CELL4 in response to the transmission command signal. The battery controller 10 reads these values. In the following description, the output voltage values of the unit dells 1 transmitted to the battery controller 10 are named as V1, V2, V3 . . . Vn from the negative electrode side towards the positive electrode side of the battery group 3 in FIG. 7.

When input of the response signals CELL1-CELL4 from each of the integrated circuits CC1-CC3 is complete, the battery controller 10 determines if cranking of the internal combustion engine by the electric motor 2 is underway in a step S34 on the basis of the input signals from the electric motor 2.

When cranking of the internal combustion engine is not underway, the battery controller 10 determines if cranking of the internal combustion engine has been completed in a step S35.

When cranking of the internal combustion engine has not been completed, it means that cranking of the internal combustion engine is not started yet. In this case, the battery controller 10 compares the output voltage values V1-Vn of the unit cells 1 with the first over discharge threshold voltage Va in a step S36.

When, as a result of comparison, all of the output voltage values V1-Vn are equal to or greater than the first over discharge threshold voltage Va, the battery controller 10 determines that the battery group 3 is operating normally. In this case, the battery controller 10 terminates the routine.

If, as a result of comparison in the step S36, any of the output voltage values V1-Vn is lower than or equal to the first over discharge threshold voltage Va, the battery controller 10 turns on the warning lamp in a step S37 and terminates the routine.

When cranking of the internal combustion engine is underway in the step S34, the battery controller 10 determines in a step S38 if input of the output voltage values V1-Vn during the present cycle period is complete.

When the determination in the step S38 is negative, the battery controller 10 compares the output voltage values V1-Vn of the unit cells 1 with the first over discharge threshold voltage Va in the step S36 as in the case of the occasion before the start of cranking. If the determination in the step S38 is negative, the output voltage values V1-Vn detected during the present cycle period T are those detected before the start of cranking. In this case, the first over-discharge threshold voltage Va for the no load state is applied to assess the output voltage values V1-Vn in the step S36.

When, on the other hand, the determination in the step S38 is affirmative, it means that the output voltage values V1-Vn read in the step S33 are the values detected while cranking of the internal combustion engine by the electric motor 2 is underway. The battery controller 10 then compares the output voltage values V1-Vn with the second over-discharge threshold voltage Vb in a step S39.

When, as a result of the comparison in the step S39, all of the output voltage values V1-Vn are higher than the second over-discharge threshold voltage Vb, the battery controller 10 determines that the battery group 3 is operating normally. In this case, the battery controller 10 terminates the routine.

When, on the other hand, any of the output voltage values V1-Vn is lower than or equal to the second over-discharge threshold voltage Vb in the step S39, the battery controller 10 turns on the warning lamp in the step S37 and terminates the routine.

When it is determined that cranking of the internal combustion engine has been completed in the step S35, the battery controller 10 determines in a step S40 if input of the output voltage values V1-Vn during the present cycle period is complete.

When the determination in the step S40 is negative, the battery controller 10 compares the output voltage values V1-Vn with the second over discharge threshold voltage Vb in a step S41, as in the case where cranking is underway. If the determination in the step S40 is negative, the output voltage values V1-Vn read in the step S33 are the values detected while cranking is underway. In this case, the second over-discharge threshold voltage Vb for the loaded state is applied to assess the output voltage values V1-Vn in the step S41.

If, as a result of the comparison performed in the step S41, all of the output voltage values V1-Vn are higher than the second over discharge threshold voltage Vb, the battery controller 10 determines that the battery group 3 is operating normally. In this case, the battery controller 10 terminates the routine.

When, on the other hand, any of the output voltage values V1-Vn is lower than or equal to the second over discharge threshold voltage Vb in the step S41, the battery controller 10 turns on the warning lamp in a step S43 and terminates the routine.

When the determination in the step S40 is affirmative, it means that the output voltage values V1-Vn read in the step S33 are the values detected after cranking of the internal combustion engine is completed. The battery controller 10 then compares the output voltage values V1-Vn with the first over-discharge threshold voltage Va in a step S42.

If, as a result of comparison performed in the step S42, all of the output voltage values V1-Vn are higher than the first over discharge threshold voltage Va, the battery controller 10 determines that the battery group 3 is operating normally. In this case, the battery controller 10 terminates the routine.

When, on the other hand, any of the output voltage values V1-Vn is lower than or equal to the first over-discharge threshold voltage Va in the step S42, the battery controller 10 turns on the warning lamp in the step S43, terminates the routine, and resumes the routine at the start timing of the next cycle period T starts.

By performing the routine described above, the output voltage values V1-Vn of the unit cells 1 detected in a state where no cranking is performed are compared with the first over discharge threshold voltage Va as shown in FIGS. 8A, 8B and FIGS. 9A, 9B, an abnormality in the battery group 3 is determined, and the warning lamp is turned on when an abnormality is found. The output voltage values V1-Vn of the unit cells 1 detected in a state where cranking is underway are compared with the second over-discharge threshold voltage Vb that is lower than the first over-discharge threshold voltage Va as shown in FIGS. 8A, 8B and FIGS. 9A, 9B, an abnormality in the battery group 3 is determined, and the warning lamp is turned on when an abnormality is found.

Figure 8:
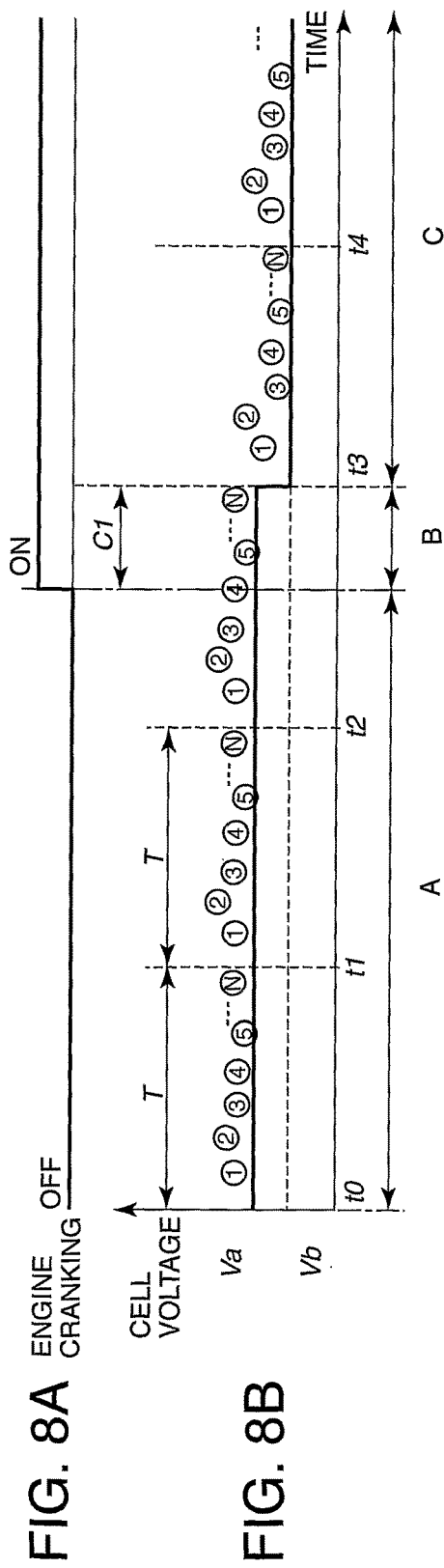
FIGS. 8A and 8B are timing charts showing input timings of output voltage values of unit cells into a battery controller according to the third embodiment of this invention during a time period around a cranking start of an internal combustion engine.

Referring to FIGS. 8A and 8B, the cranking start timing of the internal combustion engine by the electric motor 2, or in other words the timing at which cranking switches from OFF to ON in FIG. 8A does not coincide with the border of the cycle period T at which the battery controller 10 detects the output voltage values V1-Vn and determines an abnormality of the battery group 3. In FIGS. 8A and 8B, input of all of the detected output voltage values V1-Vn into the battery controller 10 is not completed until a delay time C1 elapses after cranking switches from OFF to ON.

Therefore, the battery controller 10 does not immediately switches the over-discharge threshold voltage even when the start of cranking of the internal combustion engine is detected. The battery controller 10 switches the over-discharge threshold voltage from the first over-discharge threshold voltage Va to the second-over discharge threshold voltage Vb during the next cycle period T in which the comparison is performed, because the output voltage values V1-Vn stored in the memory of the digital computation circuit 24 are those detected before the start of cranking.

Figure 9:
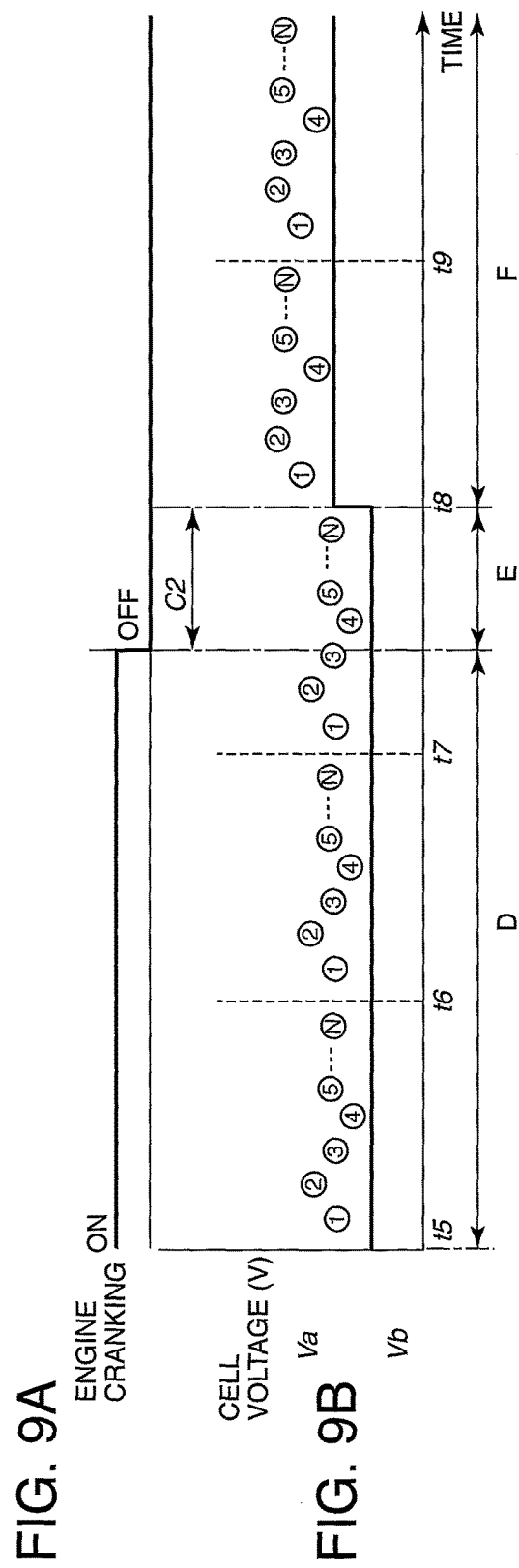
FIGS. 9A and 9B are timing charts showing input timings of output voltages of the unit cells into the battery controller according to the third embodiment of this invention during a time period around a cranking completion of the internal combustion engine.

Referring to FIGS. 9A and 9B, when the electric motor 2 stops cranking the internal combustion engine and the battery controller 10 detects cranking completion, the battery controller 10 switches the over-discharge threshold voltage from the second over-discharge threshold voltage Vb to the first over-discharge threshold voltage Va during the next cycle period T in which the comparison is performed. In other words, the switch from the second over-discharge threshold voltage to the first over-discharge threshold voltage is delayed until a delay time C2 elapses after cranking switches from OFF to ON in FIG. 9A.

Referring to FIGS. 8A and 8B, during a time period A until cranking is actually started, the internal combustion engine is not cranked. In this state, since the battery group 3 bears no load, the battery controller 10 compares at a time t1 the output voltage values of the unit cells 1 detected at a time t0 with the first over-discharge threshold voltage. The battery controller 10 compares at a time t2 the output voltage values of the unit cells 1 detected at a time t1 with the first over-discharge threshold voltage. The intervals of time t0, t1, t2, t3, . . . correspond to the cycle period T.

When the electric motor 2 starts cranking of the internal combustion engine, an electrical load is exerted on the battery group 3. At this point, however, the battery controller 10 is still receiving the output voltage values of the unit cells 1 detected at a time t2. The battery controller 10 therefore does not switch the over-discharge threshold voltage from the first over-discharge threshold voltage Va to the second over-discharge threshold voltage Vb immediately. Instead the battery controller 10 performs the switch in a cycle period T starting from a time t3 after the comparison of the output voltage values with the first over discharge threshold voltage Va is complete. Thereafter, the battery controller 10 periodically compares the output voltage values of the unit cells 1 with the second over-discharge threshold voltage Vb until cranking of the internal combustion engine by the electric motor 2 is completed.

Referring to FIGS. 9A and 9B, when cranking of the internal combustion engine is complete, the battery controller 10 applies the second over-discharge threshold voltage Vb of the first comparison after cranking switches from ON to OFF. The over-discharge threshold voltage is switched from the second over discharge threshold voltage Vb to the first over discharge threshold voltage Va in a following cycle period T starting from a time t8. Thereafter, the battery controller 10 periodically compares the output voltage values of the unit cells 1 with the first over-discharge threshold voltage Va until the electric motor 2 is driven again for running, for example.

According also to this embodiment, with respect to detection of the output voltages of the unit cells 1, output of the voltage sampling and holding command signal to the integrated circuit CC3 in the step 32 and output of the transmission command signal to the integrated circuit CC3 in the step S33 are performed separately, as in the case of the first embodiment. As a result, the required time for detecting the output voltages of the unit cells 1 is shortened and the delay times C1 and C2 with respect to the switch between the first over-discharge threshold voltage Va and the second over-discharge threshold voltage Vb can be shortened. According to this embodiment, the abnormality determination relating to the battery group 3 can be performed precisely irrespective of whether or not cranking of the internal combustion engine by the electric motor 2 is underway.

The first to third embodiments described above assume that three battery modules and three integrated circuits are provided, but the monitoring device according to this invention can be implemented irrespective of the number of battery modules and integrated circuits.

Referring to FIG. 11 and FIGS. 12A-12F, a fourth embodiment of this invention will be described.

This embodiment differs from the second embodiment in that the number of battery modules and integrated circuits is assumed to be an indefinite number n, and in that the monitoring device further comprises temperature sensors 7 for detecting the atmospheric temperature of the battery modules M1-Mn, a current sensor 8 for detecting an output power current of the entire battery group 3, and an entire output voltage detection circuit 20 for detecting an entire output voltage of the battery group 3. Detection values by the sensors/circuit are input into the battery controller 10 via independent signal circuits, respectively. The other components of the device are identical to those of the second embodiment.

According to this embodiment, the battery controller 10 is programmed to calculate a highest cell voltage VHa (VHb) or a lowest cell voltage VLa (VLb) of unit cells 1 and regulate an output power of the battery group 3 on the basis of the highest cell voltage VHa (VHb) or the lowest cell voltage VLa (VLb).

Figure 11:
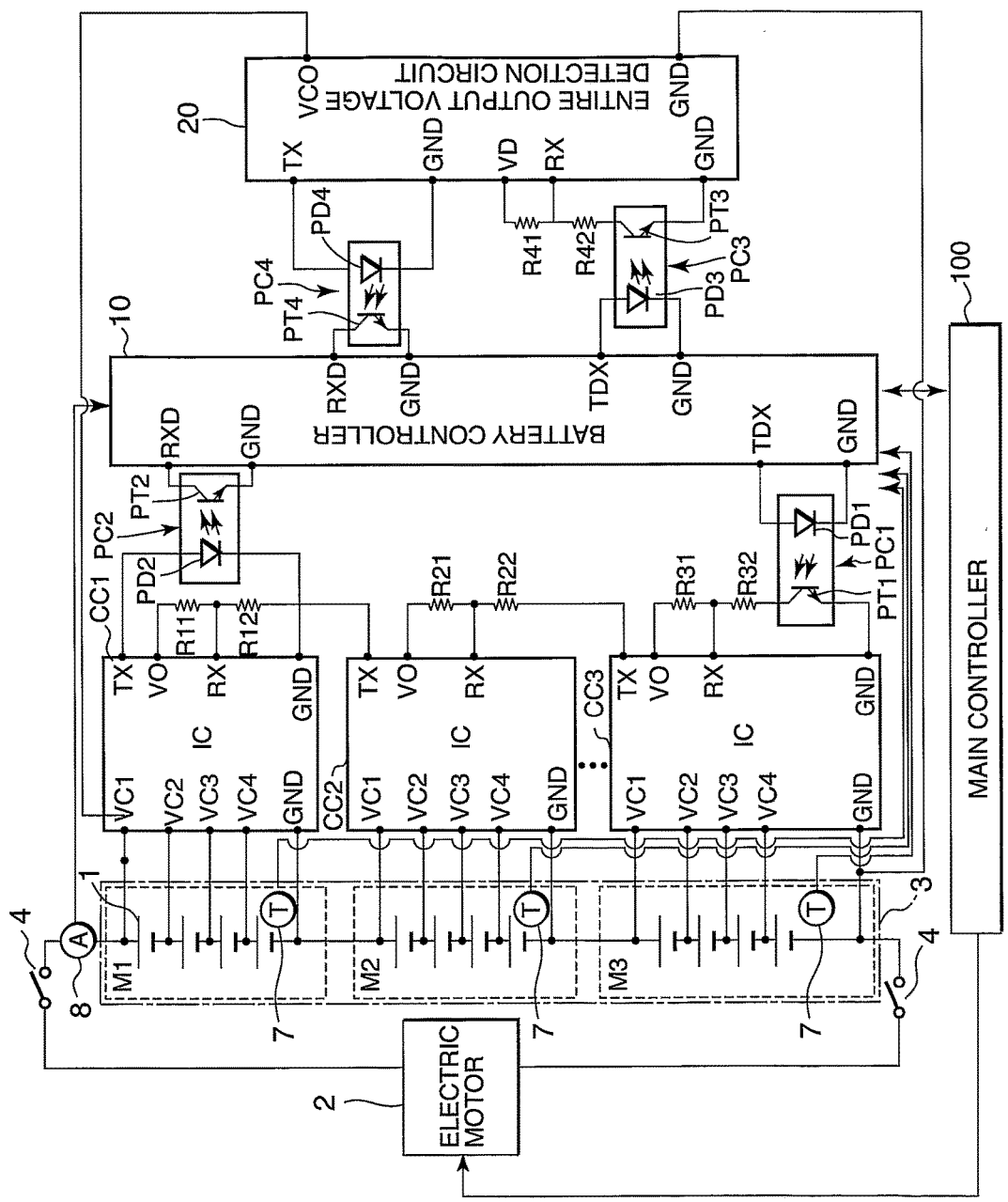
FIG. 11 is an electric circuit diagram of a battery voltage-monitoring device according to a fourth embodiment of this invention."

According also to this embodiment, similarly to the processing of the steps S32, S33 of the third embodiment, the he battery controller 10 outputs a voltage sampling and holding command signal and a transmission command signal separately to an integrated circuit CCn connected to a battery module Mn that is located nearest to the negative electrode of the battery 3 as shown in FIG. 11.

The integrated circuits CC1-CCn, when receiving the voltage sampling and holding command signal, detect the output voltages of the unit cells 1 of the battery modules M1-Mn and store the detected voltage values in the memory, respectively. The integrated circuits CC1-CCn are connected via a cascade communication circuit to the battery controller 10 and output the stored output voltage values sequentially at regular intervals to the battery controller 10 as shown in FIG. 12A in response to the transmission command signal. A cycle period in which the integrated circuits CC1-CCn output the stored output voltage values is herein named as a sampling cycle period T1.

The time period from when the battery controller 10 outputs the voltage sampling and holding command signal until the output voltage values of all of the unit cells 1 are input into the battery controller 10 from the integrated circuits CC1-CCn is named as a sampling cycle period T2 as shown in FIG. 12B.

According to this monitoring device also, since the voltage sampling and holding command signal is transmitted between the integrated circuits CC1-CCn, which are connected by the cascade communication circuit, prior to output of the stored voltage values as in the case of the first-third embodiments, the sampling period T2 can be shortened in comparison with the prior art monitoring device.

When the sampling cycle period T2 is long, it takes a long time until a variation in the output voltages of the unit cells 1 is reflected in control of the output power of the battery group 3.

To shorten this time, the battery controller 10 periodically calculates the output voltages of the unit cells during the sampling cycle period T2 and controls the output power of the battery group 3 on the basis of the calculation result, thereby preventing over-charge/over-discharge of the battery group 3.

Referring to FIG. 12B, the current sensor 8 detects an output power current of the battery group 3 in every sampling cycle period T1 and outputs the detected power current value to the battery controller 10 accordingly. The entire output voltage detection circuit 20 detects an entire output voltage of the battery group 3 in every sampling cycle period T1 and outputs the detected current value to the battery controller 10 accordingly. The temperature sensors 7 are disposed in the vicinity of the battery modules M1-Mn. The temperature sensors 7 detect the atmospheric temperatures of the battery modules M1-Mn in every sampling cycle period T1 and respectively output the detected temperature to the battery controller 10.

Next, control of the output power of the battery group 3 by the battery controller 10 will be described.

Herein, the sampling cycle period T1 is set to equal an input cycle of the output voltage values of the unit cells 1 input into the battery controller 10 from the integrated circuits CC1-CCn.

At a time t1 before the relay 4 is turned ON, the battery controller 10 outputs a voltage sampling and holding command signal commanding the integrated circuits CC1-CCn to sample and hold the output voltages of the unit cells 1. After confirming that the signal has been transmitted to the integrated circuit CC1 located at a downstream end of the cascade communication circuit, the battery controller 10 outputs a transmission command signal commanding the integrated circuits CC1-CCn to transmit the stored output voltage values to the battery controller 10. At the time t1, since the relay 4 is in the OFF state, the input values input into the battery controller 10 during the sampling cycle period T2 are the values detected when the battery group 3 is in a no load state. At a time t1+T1, the relay 4 is turned ON and thereafter an electrical load is exerted on the battery group 3 as shown in FIG. 12C.

In contrast, the entire output voltage Vs of the battery group 3 from the entire output voltage detection circuit 20, the output power current Ia of the battery group 3 from the current sensor 8, and the atmospheric temperatures of the battery modules M1-Mn from the temperature sensors 7 are input into the battery controller 10 in every sampling cycle period T1.

As a result of outputting the transmission command signal, the output voltage values of the unit cells 1 are input into the battery controller 10 from the integrated circuits CC1-CCn sequentially in every sampling period T1 throughout a sampling cycle period T2 starting from the time t1. Input of the output voltage value values of the unit cells 1 is terminated immediately before a time t2, which is equal to a time t1+T2.

At a time t1+T1 when the sampling cycle period T1 has elapsed from the time t1, the output voltage values of the unit cells 1 output from the integrated circuit CCn, the entire output voltage Vs of the battery group 3 output from the entire output voltage detection circuit 20, the power current Ia output from the battery group 3 from the current sensor 8, and the atmospheric temperatures of the integrated circuits CC1-CCn output from the temperature sensors 7 are input into the battery controller 10. Since the sensors 7, 8 and the entire output voltage detection circuit 20 are connected to the battery controller 10 via independent signal circuits, no time loss is assumed from detection of the date to input of the detected data into the battery controller 10. In other words, these data are detected and input into the battery controller 10 at the time t1+T1. After the time t1+T1, the entire output voltages Vs of the battery group 3, the output power current Ia from the battery group 3, and the atmospheric temperatures of the battery modules M1-Mn are input into the battery controller 10 in every sampling cycle period T1 along with the output voltage values of the unit cells 1 of a specific battery module Mx (x=1, 2, ... n).

When input of all of the output voltage values of the unit cells 1 into the battery controller 10 is complete, the battery controller 10 immediately extracts a highest cell voltage VH1 and a lowest cell voltage VL1 among the output voltage values of all of the unit cells 1.

The battery controller 10 again outputs a voltage sampling and holding command signal and a voltage sampling to the integrated circuit CCn at a time t2 (=t1+T2) from which a following sampling cycle period T2 starts.

From the time t2+T1 onward, the entire output voltage Va of the battery group 3, the output power current Ia of the battery group 3, and the atmospheric temperatures of the battery modules M1-Mn are input into the battery controller 10 along with the output voltage values of the unit cells 1 of a specific battery module Mx (x=1, 2, ... n).

The battery controller 10 in this way reads all of the output voltage values of the unit cells 1 in every sampling cycle period T2. The battery controller 10, on the other hand, reads the entire output voltage Va of the battery group 3, the output power current Ia of the battery group 3, and the atmospheric temperatures of the battery modules M1-Mn in every sampling cycle period T1.

The battery controller 10 then performs the following calculation using the data obtained in this way.

Specifically, as shown in FIG. 12D, the battery controller 10 extracts a highest cell voltage VH1 and a lowest cell voltage VL1 from all of the output voltage values of the unit cells 1 of the battery modules M1-Mn at the end of the sampling cycle period T2 starting at the time t1.

Herein, the highest cell voltage VH1 and the lowest cell voltage VL1 are those detected immediately after the time t1 when the battery group 3 is still in the no load state. The output power current Ia of the battery group 3 at this timing is zero ampere (0 A). A value obtained by dividing the entire output voltage Vs of the battery group 3 by the number n of the unit cells 1 forming the battery group 3 corresponds to an average output voltage of the unit cell 1 in the no load state.

The battery controller 10 calculates a voltage deviation VdH1 of the highest cell voltage using the following relation (1).

$$VdH1 = VH1 \times n - Vs1 \quad (1)$$

The battery controller 10 calculates a voltage deviation VdL1 of the lowest cell voltage using the following relation (2).

$$VdL1 = Vs1 - VL1 \times n \quad (2)$$

Differences in output voltage characteristics of the unit cells 1 are generated by manufacturing error, etc. Further, output voltage characteristics may be affected by repeatedly charging and discharging the unit cells 1.

The battery controller 10 calculates the voltage deviations representing the inherent output voltage characteristics of the unit cells 1 by applying the relations (1) and (2).

The battery controller 10 performs the following calculation in every sampling cycle period T1 during the present sampling cycle period T2 using the voltage deviation VdH1 of the highest cell voltage and the voltage deviation VdL1 of the lowest cell voltage, which are obtained in the first sampling cycle period T2.

Specifically, the battery controller 10 calculates a highest voltage VHa by applying a relation (3) below using the voltage deviation VdH1 of the highest cell voltage and the entire output voltage Vsa of the battery group 3 detected in every sampling cycle period T1 after the time t2, This value corresponds to an estimated highest voltage that the output voltages of the unit cells 1 can take during the present sampling cycle period T2.

$$VHa = (Vsa + VdH1)/n \quad (3)$$

The entire output voltage Vsa of the battery group 3 is a value detected in every sampling period T1 after the time t2. Since the sampling period T1 is shorter than the sampling cycle period T2 of the output voltages of the unit cells 1, the entire output voltage Vs of the battery group 3 shows a more continuous variation than the output voltage of each unit cell 1. The voltage deviation VdH1 of the highest cell voltage is a value obtained during the first sampling cycle period T2 and corresponds to a deviation between the entire output voltage Vs1 at the time t2 and the highest cell voltage VH1. Herein, the highest cell voltage VH1 is a value detected immediately after the time t1 at which the output power current Ia of the battery group 3 is zero ampere, and represents a deviation in the inherent output voltage characteristics of the unit cells 1.

The output voltages of the unit cells 1 varies by a large amount at a time t1+T1 when the battery group 3 transits from a no load state to a loaded state. Since the voltage deviation VdH1 of the highest cell is a value depending on the inherent output voltage characteristics of the unit cells 1, the amplitude of VdH1 is smaller than the amplitude of the variation in the output voltages of the unit cells 1 between a no load state and a loaded state.

In the relation (3) for calculating the estimated highest voltage, the battery controller 10 takes the entire output voltage Vsa of the battery group 3, which varies in a continuous fashion as a base and adds the voltage deviation VdH1 of the highest cell representing the inherent output voltage characteristics of the unit cells 1 thereto. Continuity is thereby assumed in output voltage variation during the sampling cycle period T2 after the time t2 and redundancy is ensured in output voltage control of the battery group 3.

The battery controller 10 also calculates a lowest voltage VLa in every sampling cycle period T1 by applying a relation (4) below using the voltage deviation VdL1 of the lowest cell voltage and the entire output voltages Vsa detected in every sampling cycle period T1 starting from the time t2. This value corresponds to an estimated lowest voltage that the output voltages of the unit cells 1 can take during the present sampling cycle period T2.

$$VLa=(Vsa-VdL1)/n \quad (4)$$

At a time t3−T1, the battery controller 10 finishes reading the output voltage values of all of the unit cells 1 that the integrated circuits CC1-CCn have detected. These values are detected immediately after the time t2 in a loaded state of the battery group 3. The battery controller 10 extracts a highest cell voltage VH2 and a lowest cell voltage VL2 from all of the output voltage values of the unit cells 1 of the battery modules M1-Mn. The battery controller 10 calculates an internal resistance deviation RdH2 of the highest cell voltage applying a relation (5) below using the voltage deviation VdH1 of the highest cell, the entire output voltage VS2 of the battery group 3 that was detected at the time t2, and an output power current I2 of the battery group 3 detected at the time t2.

$$RdH2=(VH2 \times n-VS2-VdH1)/I2 \quad (5)$$

Herein, VH2×n−VS2 corresponds to a voltage deviation of the highest cell voltage at the time t2. The relation (5) is a relation to convert a variation in the voltage deviations during a time period from the time t1 to the time t2 into a resistance value.

In a similar manner, the battery controller 10 calculates an internal resistance deviation RdL2 of the lowest cell voltage by applying a relation (6) using the voltage deviation VdL1 of the lowest cell voltage, the entire output voltages VS2 of the battery group 3 detected at the time t2, and the output power current I2 of the battery group 3 detected at the time t2.

$$RdL2=(VS2-VL2 \times n-VdL1)/I2 \quad (6)$$

The battery controller 10 calculates a highest cell voltage VHb in every sampling cycle period T1 throughout a sampling cycle period T2 staring at a time t3 by applying a relation (7) below using the voltage deviation VdH1 of the highest cell, an entire output voltage Vsb of the battery group 3 detected in every sampling cycle period T1, the internal resistance deviation RdH2 of the highest voltage, and an output power current I2 of the battery group 3 detected in every sampling cycle period T1. Herein, VdH1 and RdH2 are values calculated immediately before the time t3. Vsb and Ib are values input into the battery controller 10 in every sampling cycle period T1. The highest cell voltage VHb thus calculated corresponds to an estimated highest value that the output voltage values of the unit cells 1 can take in every sampling cycle period T1 during in the present sampling cycle period T2.

$$VHb=(VS2+VdH1+RdH2 \times Ib)/n \quad (7)$$

The entire output voltages Vsb detected in every sampling cycle period T1 has a continuity throughout the sampling cycle period T2. The voltage deviation VdH1 of the highest cell represents inherent output voltage characteristics of the unit cells 1. RdH2×Ib represents a fluctuation in the output voltage values of the unit cells 1 accompanying a time change between the time t2 and the time t3.

According to the relation (7), therefore, the highest cell voltage VHb in every sampling cycle period T1 during a sampling cycle period T2 starting from the time t3 can be calculated with precision on the basis of the entire output voltage Vsb of battery group 3 that varies in a continuous fashion, considering the inherent output voltage characteristics of the unit cells 1 and the fluctuation in the output voltage values of the unit cells 1 accompanying a time change between the time t2 and the time t3.

The battery controller 10 also calculates a lowest cell voltage VLb in every sampling cycle period T1 during the sampling cycle period T2 staring at the time t3 detected in every sampling cycle period T1 by applying a relation (8) below using the voltage deviation VdL1 of the lowest cell voltage, the entire output voltage Vsb of the battery group 3, the internal resistance deviation RdL2 of the lowest voltage, and the output power current I2 of the battery group 3 detected in every sampling cycle period T1 during the present sampling cycle period T2.

$$VLb=(Vsb-VdL1-RdL2 \times Ib)/n \quad (8)$$

The battery controller 10 continues to calculate the highest cell voltage VHb and the lowest cell voltage VLb in every sampling period T1 during a sampling cycle period T2 starting at the time t4 and later.

The battery controller 10 transmits the highest cell voltage VHa (VHb) and the lowest cell voltage VHa (VLb) thus calculated to the main controller 100. The main controller 100 controls the output power of the battery group 3 and a charging amount to and a discharging amount from the battery group 3 on the basis of the highest cell voltage VHa (VHb) and the lowest cell voltage VHa (VLb).

According to this embodiment also, since the voltage sampling and holding command signal is transmitted between the integrated circuits CC1-CCn, which are connected by the cascade communication circuit, prior to output of the stored voltage values, the sampling cycle period T2 can be set shorter. The short sampling cycle period T2 means that the detection frequency of the output voltage of all of the unit cells 1 is high. Accordingly, making the sampling cycle time T2 short brings about an increase in the precision with which the output power of the battery group 3 is controlled.

According to this embodiment, at the end of the first starting sampling cycle T2 from the time t1, the battery controller 10 calculates the voltage deviation of the highest cell voltage using the highest cell voltage extracted from the detected output voltage values of the unit cells and the entire output voltage of the battery group 3 detected in every sampling cycle period T1. The battery controller 10 estimates the highest output voltage of the unit cells 1 in the next sampling cycle T2 on the basis of the voltage deviation of the highest cell voltage and the entire output voltage of the battery group 3 detected in every sampling cycle period T1. Using the estimated highest output voltage thus estimated, control of the output power of the battery group 3 can be performed repeatedly at intervals corresponding to the sampling cycle period T1, which is shorter than the sampling cycle period T2 required for detecting the output voltages of the unit cells 1. As a result, the control precision of the output power of the battery group 3 can be increased.

Further, according to this embodiment, the highest cell voltage and lowest cell voltage are estimated on the basis of the entire output voltage of the battery 3, which is detected in every short sampling cycle period T1 and varies continuously as a result by applying a voltage deviation that exhibits little time-dependent variation by nature, and therefore continuity in the estimated values is assured, which is preferable as a control parameter.

When an electrical load is exerted on the battery group 3, the output voltages of the unit cells 1 vary by a greater amount than when the battery group 3 is in a no-load state. According to this embodiment, the highest cell voltage and lowest cell voltage during the sampling cycle period T2 starting from the time t3 and onward are estimated in every cycle period T1 on the basis of the entire output voltage of the battery 3 detected in every cycle period T1 that is shorter than the cycle period T2, and the voltage deviation and internal resistance deviation are calculated in every sampling period T2. As a result, the variation in the output voltages of the unit cells 1 accompanying the variation in the entire output voltage of the battery group 3 can be grasped precisely at an early stage.

It is preferable to use detection values of the temperature sensors 7 to calculate the highest cell voltage or the lowest cell voltage of the unit cell 1. The internal resistance deviation RdH2 of the highest cell voltage and the internal resistance deviation RdL2 of the lowest cell voltage vary in accordance with the temperature of the unit cells 1. Therefore, if the temperatures detected by the temperature sensors 7 are considered in the calculation of the internal resistance deviation, the highest cell voltage or the lowest cell voltage of the unit cells 1 can be calculated more precisely.

The contents of Tokugan 2009-121636, with a filing date of May 20, 2009 in Japan, and Tokugan 2010-093273 with a filing date of Apr. 14, 2010 are hereby incorporated by reference.

Although the invention has been described above with reference to certain embodiments, the invention is not limited to the embodiments described above. Modifications and variations of the embodiments described above will occur to those skilled in the art, within the scope of the claims.

The embodiments of this invention in which an exclusive property or privilege is claimed are defined as follows:

INDUSTRIAL FIELD OF APPLICATION

As described above, the voltage monitoring device according to this invention is suitable for a hybrid drive electric vehicle and an electric vehicle, but not limited thereto.

The embodiments of this invention in which an exclusive property or privilege is claimed are defined as follows:

1. A battery voltage monitoring device for monitoring an output voltage of a unit cell or unit cells in each of battery modules that are connected in series, comprising:
   integrated circuits, each of which samples and holds the output voltage of the unit cell or unit cells in each of the battery modules;
   a cascade communication circuit that connects the integrated circuits in series to transmit signals to the integrated circuits according to a connection order of the integrated circuits; and
   a programmable controller connected to an integrated circuit located at an upstream end of the cascade communication circuit and an integrated circuit located at a downstream end of the cascade communication circuit with respect to signal transmission;
   wherein the controller is programmed to:
      output a voltage sampling and holding command signal to the integrated circuit at the upstream end such that the voltage sampling and holding command signal be transmitted to each of the integrated circuits via the cascade communication circuit, the voltage sampling and holding command signal commanding each of the integrated circuits to sample and hold the output voltage of the unit cell or unit cells in each of the battery modules; and
      output a transmission command signal to the integrated circuit at the upstream end such that the transmission command signal be transmitted via the cascade communication circuit to each of the integrated circuits after transmission of the voltage sampling and holding command signal, the transmission command signal commanding each of the integrated circuits to transmit the output voltage held by each of the integrated circuits to the controller via the cascade communication circuit,
   wherein the device further comprises an entire output voltage detection circuit that detects an entire output voltage of the battery modules, and the controller is further programmed to calculate, assuming that a period required to transmit the output voltage of the unit cell or unit cells held by the integrated circuits to the controller is a second cycle period, the output voltage of the unit cell or unit cells at intervals corresponding to a first cycle period that is shorter than the second cycle period on the basis of the output voltages transmitted from the integrated circuits at intervals corresponding to the second cycle period and the entire output voltage of the battery modules that is detected by the entire output voltage detection circuit at intervals corresponding to the first cycle period, and
   wherein the controller is further programmed to calculate the output voltage of each of the unit cells at intervals corresponding to the first cycle period on the basis of a maximum value and a minimum value of the output voltages transmitted from the integrated circuits to the controller in a last interval corresponding to the second cycle period and an entire output voltage of the battery modules that is detected by the entire output voltage detection circuit at the intervals corresponding to the first cycle period.

2. The battery voltage monitoring device as defined in claim 1, wherein the controller is further programmed to calculate a difference between a value obtained by multiplying the maximum value of the output voltages transmitted from the integrated circuits to the controller during the previous interval corresponding to the second cycle period by a number of the unit cells of the battery modules and an entire output voltage of the battery modules that is detected by the entire output voltage detection circuit at a timing when the controller outputs the voltage sampling and holding command signal to the integrated circuit at the upstream end as a maximum battery voltage deviation, calculate a difference between a value obtained by multiplying the minimum value of the output voltages transmitted from the integrated circuits to the controller during the previous interval corresponding to the second cycle period by a number of the unit cells of the battery modules and an entire output voltage of the battery modules that is detected by the entire output voltage detection circuit at a timing when the controller outputs the voltage sampling and holding command signal to the integrated circuit at the upstream end as a minimum battery voltage deviation, calculate a maximum cell output voltage at the intervals corresponding to the first cycle period using an entire output voltage of the battery modules detected by the entire output voltage detection circuit at the intervals corresponding to the first cycle period and the maximum battery voltage deviation, and calculate a minimum cell output voltage at the intervals corresponding to the first cycle period using the entire output voltage of the battery modules detected by the entire output voltage detection circuit at the intervals corresponding to the first cycle period and the minimum battery voltage deviation.

3. The battery voltage monitoring device as defined in claim 2, further comprising a current sensor that detects an entire output current of the battery modules, wherein the controller is further programmed to calculate an internal resistance deviation corresponding to the maximum battery voltage at the intervals corresponding to the first cycle period from an entire output voltage of the battery modules detected in a state where the entire output voltage of the battery modules was not zero, the maximum value of the output voltages transmitted from the integrated circuits to the controller during the last interval corresponding to the second cycle period, and the maximum battery voltage deviation, calculate an internal resistance deviation corresponding to the minimum battery voltage at the intervals corresponding to the first cycle period from the entire output voltage of the battery modules detected in a state where the entire output voltage of the battery modules was not zero, the minimum value of the output voltages transmitted from the integrated circuits to the controller during the last interval corresponding to the second cycle period, and the minimum battery voltage deviation, and calculate the maximum cell output voltage and the minimum cell output voltage at the intervals corresponding to the first cycle period according to the following equations (A) and (B):

$$VHb = (Vsb + VdH1 + RdH2 \times Ib)/n \quad (A)$$

$$VLb = (Vsb - VdL1 - RdL2 \times Ib)/n \quad (B)$$

where, VHb=maximum cell voltage calculated at intervals corresponding to first cycle period;
VLb=minimum cell voltage calculated at intervals corresponding to first cycle period;
Vsb=entire output voltage of battery modules detected at intervals corresponding to first cycle time;
VdH1=maximum battery voltage deviation;
RdH2=internal resistance deviation corresponding to the maximum battery voltage;
Ib=entire output current of battery modules if detected at intervals corresponding to first cycle period;
n=number of unit cells of battery modules; and
RdL2=internal resistance deviation corresponding to the minimum battery voltage.

* * * * *